US009046765B2

(12) United States Patent
Nakashima et al.

(10) Patent No.: US 9,046,765 B2
(45) Date of Patent: Jun. 2, 2015

(54) RESIST PATTERN-FORMING METHOD, RESIST PATTERN-FORMING RADIATION-SENSITIVE RESIN COMPOSITION, AND RESIST FILM

(71) Applicant: JSR CORPORATION, Tokyo (JP)

(72) Inventors: Hiromitsu Nakashima, Tokyo (JP); Toru Kimura, Tokyo (JP); Yusuke Asano, Tokyo (JP); Masafumi Hori, Tokyo (JP); Reiko Kimura, Tokyo (JP); Kazuki Kasahara, Tokyo (JP); Hiromu Miyata, Tokyo (JP); Masafumi Yoshida, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/037,659

(22) Filed: Sep. 26, 2013

(65) Prior Publication Data

US 2014/0023968 A1 Jan. 23, 2014

Related U.S. Application Data

(63) Continuation of application No. PCT/JP2012/058265, filed on Mar. 28, 2012.

(30) Foreign Application Priority Data

Mar. 31, 2011 (JP) ................................ 2011-081331

(51) Int. Cl.
*G03F 7/004* (2006.01)
*C08F 12/20* (2006.01)
*H01L 21/027* (2006.01)
*C08F 220/22* (2006.01)
*C08F 220/24* (2006.01)
*C08F 220/28* (2006.01)
*G03F 7/20* (2006.01)
*G03F 7/039* (2006.01)
*G03F 7/11* (2006.01)

(52) U.S. Cl.
CPC ............ *G03F 7/0041* (2013.01); *H01L 21/027* (2013.01); *H01L 21/0274* (2013.01); *C08F 220/22* (2013.01); *C08F 220/24* (2013.01); *C08F 220/28* (2013.01); *C08F 2220/283* (2013.01); *G03F 7/2041* (2013.01); *G03F 7/0045* (2013.01); *G03F 7/0046* (2013.01); *G03F 7/0397* (2013.01); *G03F 7/11* (2013.01)

(58) Field of Classification Search
CPC ..... G03F 7/004; G03F 7/2041; G03F 7/0395; G03F 7/0397; G03F 7/0045; G03F 7/0046; Y10S 430/913; Y10S 430/914; H01L 21/027; H01L 21/0271; H01L 21/0274; C08F 220/24; C08F 220/28
USPC ............... 430/270.1, 913, 396, 322; 526/242, 526/245, 319

See application file for complete search history.

(56) References Cited

U.S. PATENT DOCUMENTS

| 7,611,820 | B2 * | 11/2009 | Kanda et al. | 430/270.1 |
| 7,611,821 | B2 * | 11/2009 | Nishi et al. | 430/270.1 |
| 7,704,674 | B1 * | 4/2010 | Amblard et al. | 430/270.1 |
| 7,968,268 | B2 * | 6/2011 | Wang | 430/270.1 |
| 8,715,902 | B2 * | 5/2014 | Wang | 430/270.1 |
| 2005/0277059 | A1 | 12/2005 | Kanda | |
| 2007/0269734 | A1 | 11/2007 | Kimura et al. | |
| 2008/0038661 | A1 | 2/2008 | Chiba et al. | |
| 2009/0117489 | A1 * | 5/2009 | Wang et al. | 430/270.1 |
| 2009/0202945 | A1 | 8/2009 | Nakagawa et al. | |
| 2010/0028804 | A1 * | 2/2010 | Iwato et al. | 430/270.1 |
| 2012/0034558 | A1 * | 2/2012 | Chang | 430/270.1 |

FOREIGN PATENT DOCUMENTS

| JP | 2005-352384 | 12/2005 |
| JP | 2006-227632 | 8/2006 |
| JP | 2007-297590 | 11/2007 |
| JP | 2009-134088 | 6/2009 |
| JP | 2010-061116 | 3/2010 |
| JP | 2010-277043 | 12/2010 |
| WO | 2005/069076 | 7/2005 |
| WO | 2006/035790 | 4/2006 |
| WO | 2007/116664 | 10/2007 |

OTHER PUBLICATIONS

Office Action issued on Oct. 7, 2014 in Japanese Patent Application No. 2013-507703 with English translation.
International Search Report for corresponding International Application No. PCT/JP2012/058265 May 1, 2012.

* cited by examiner

*Primary Examiner* — Amanda C Walke
(74) *Attorney, Agent, or Firm* — Oblon, McClelland, Maier & Neustadt, L.L.P.

(57) ABSTRACT

A resist pattern-forming method includes providing a resist film having a surface free energy of 30 to 40 mN/m on a substrate using a radiation-sensitive resin composition. The resist film is exposed by applying radiation via a mask. The exposed resist film is developed. It is preferable that the exposing of the resist film includes exposing the resist film via an immersion liquid that is provided over the resist film.

18 Claims, No Drawings

… (1)

RESIST PATTERN-FORMING METHOD, RESIST PATTERN-FORMING RADIATION-SENSITIVE RESIN COMPOSITION, AND RESIST FILM

CROSS-REFERENCE TO RELATED APPLICATIONS

The present application is a continuation application of International Application No. PCT/JP2012/058265, filed Mar. 28, 2012, which claims priority to Japanese Patent Application No. 2011-081331, filed Mar. 31, 2011. The contents of these applications are incorporated herein by reference in their entirety.

BACKGROUND OF THE INVENTION

1. Field of the Invention

The invention relates to a resist pattern-forming method, a resist-pattern-forming radiation-sensitive resin composition, and a resist film.

2. Discussion of the Background

In the field of microfabrication such as production of integrated circuit devices, a fine resist pattern is formed by forming a resist film on a substrate using a resin composition that includes an acid-labile group-containing polymer, exposing the resist film by applying short-wavelength radiation (e.g., excimer laser light) to the resist film via a mask pattern, and removing the exposed area using an alkaline developer.

In recent years, liquid immersion lithography has been extensively used as a method for forming a fine resist pattern having a line width of about 45 nm. Liquid immersion lithography has an advantage in that the depth of focus decreases to only a small extent, and high resolution can be obtained even when the numerical aperture (NA) of the lens is increased. A resin composition used for liquid immersion lithography is required to prevent a decrease in film performance and contamination of the lens or the like by suppressing elution of an acid generator and the like from the resist film into the immersion medium, and make it possible to implement high-speed scan exposure by preventing a situation in which watermarks remain through an improvement in draining capability of the surface of the resist film. Japanese Patent Application Publication (KOKAI) No. 2005-352384 discloses a technique that forms an upper layer film (protective film) on the resist film in order to deal with such a demand. However, this technique takes time since it is necessary to separately form the upper layer film. Therefore, a method that improves the hydrophobicity of the surface of the resist film has been studied. WO2007/116664 discloses a resist pattern-forming method that utilizes a resin composition that contains a fluorine-containing polymer that exhibits high hydrophobicity.

SUMMARY OF THE INVENTION

According to one aspect of the present invention, a resist pattern-forming method includes providing a resist film having a surface free energy of 30 to 40 mN/m on a substrate using a radiation-sensitive resin composition. The resist film is exposed by applying radiation via a mask. The exposed resist film is developed.

According to another aspect of the present invention, a resist pattern-forming radiation-sensitive resin composition forms a resist film having a surface free energy of 30 to 40 mN/m.

According to further aspect of the present invention, a resist film has a surface free energy of 30 to 40 mN/m and is provided on a substrate using a resist pattern-forming radiation-sensitive resin composition.

DESCRIPTION OF THE EMBODIMENTS

The ordinal numbers in the terms "first structural unit", "second structural unit", "third structural unit", or the like recited in the claims and SUMMARY OF THE INVENTION and ABSTRACT of the specification of the present application are merely identifiers, but does not have any other meanings, for example, a particular order and the like. Moreover, for example, the term "first structural unit" itself does not imply an existence of the "second structural unit".

According to one embodiment of the invention, a resist pattern-forming method includes:

(1) forming a resist film having a surface free energy of 30 to 40 mN/m on a substrate using a radiation-sensitive resin composition;

(2) exposing the resist film by applying radiation via a mask; and (3) developing the exposed resist film.

According to the resist pattern-forming method, the surface of the resist film exhibits moderate water repellency as a result of forming the resist film having the above properties. Therefore, it is possible to implement high-speed scan exposure, and form an excellent resist pattern by suppressing occurrence of defects (e.g., bridge defects).

It is preferable that the exposing of the resist film include exposing the resist film via an immersion liquid that is provided over the resist film. The resist pattern-forming method may suitably be used for liquid immersion lithography as a result of forming the resist film having the above properties, and can improve the scan speed while advantageously suppressing occurrence of defects.

It is preferable that the radiation-sensitive resin composition include [A] a fluorine atom-containing polymer and [C] an acid generator. It is possible to easily control the surface free energy of the resist film, and effectively improve the scan speed while effectively suppressing occurrence of defects by utilizing such a radiation-sensitive resin composition.

It is preferable that the fluorine atom-containing polymer [A] include a structural unit (a1) that includes an alkali-labile group. When the fluorine atom-containing polymer [A] includes the structural unit (a1), affinity to an alkaline developer during alkali development can be improved. This makes it possible to more effectively suppress occurrence of defects.

It is preferable that the fluorine atom-containing polymer [A] include a structural unit (a2) that includes an acid-labile group. When the fluorine atom-containing polymer [A] includes the structural unit (a2), the fluorine atom-containing polymer [A] exhibits improved solubility in an alkaline developer in the exposed area, for example. This makes it possible to further suppress occurrence of defects in the exposed area of the resist film.

It is preferable that the fluorine atom-containing polymer [A] include a structural unit (a3) that does not include an alkali-labile group, but includes a fluorine atom. When the fluorine atom-containing polymer [A] includes the structural unit (a3), it is possible to effectively improve the water repellency of the resist film, and promote uneven distribution of the fluorine atom-containing polymer [A] in the resist film. This makes it possible to more effectively improve the scan speed while more effectively suppressing occurrence of defects.

It is preferable that the radiation-sensitive resin composition further include [B] a base polymer that includes an acid-labile group, and has a fluorine atom content lower than that of the fluorine atom-containing polymer [A] (hereinafter may be referred to as "polymer [B]"). When the radiation-sensitive resin composition includes the fluorine atom-containing polymer [A] and the polymer [B], it is possible to further promote uneven distribution of the fluorine atom-containing polymer [A] in the resist film. This makes it possible to more effectively improve the scan speed while more effectively suppressing occurrence of defects.

It is preferable that the radiation-sensitive resin composition further include [D] an acid diffusion controller. When the radiation-sensitive resin composition further includes the acid diffusion controller [D], the resolution and the like of the resulting photoresist are further improved.

According to another embodiment of the invention, a resist pattern-forming radiation-sensitive resin composition forms a resist film having a surface free energy of 30 to 40 mN/m. Since the resist pattern-forming radiation-sensitive resin composition according to the embodiment of the invention can form a resist film having a surface free energy within the above specific range, the surface of the resist film exhibits moderate water repellency. Therefore, it is possible to implement high-speed scan exposure, and form an excellent resist pattern by suppressing occurrence of defects (e.g., bridge defects).

Since the resist pattern-forming radiation-sensitive resin composition according to the embodiment of the invention has the above properties, the resist pattern-forming radiation-sensitive resin composition may suitably used for liquid immersion lithography. The resist pattern-forming radiation-sensitive resin composition makes it possible to implement high-speed scan exposure, and form an excellent resist pattern by suppressing occurrence of defects (e.g., bridge defects).

According to another embodiment of the invention, a resist film is formed on a substrate using the resist pattern-forming radiation-sensitive resin composition, and has a surface free energy of 30 to 40 mN/m. Since the resist film has a surface free energy within the above specific range, the surface of the resist film exhibits moderate water repellency. Therefore, it is possible to implement high-speed scan exposure, and form an excellent resist pattern by suppressing occurrence of defects (e.g., bridge defects).

The resist pattern-forming method according to the embodiment of the invention makes it possible to implement high-speed scan exposure, and form an excellent resist pattern by suppressing occurrence of defects (e.g., bridge defects). The embodiments will now be described in detail.

Resist Pattern-Forming Method

A resist pattern-forming method according to one embodiment of the invention includes:
(1) forming a resist film having a surface free energy of 30 to 40 mN/m on a substrate using a radiation-sensitive resin composition (hereinafter may be referred to as "step (1)");
(2) exposing the resist film by applying radiation via a mask (hereinafter may be referred to as "step (2)"); and
(3) developing the exposed resist film (hereinafter may be referred to as "step (3)"). Each step is described in detail below.

Step (1)

In the step (1), the radiation-sensitive resin composition is applied to a substrate (e.g., a silicon wafer or a wafer coated with silicon dioxide and an underlayer antireflective film) to a given thickness by spin coating, cast coating, roll coating, or the like, and prebaked (PB) to volatilize the solvent from the film to form a resist film having a surface free energy of 30 to 40 mN/m. The surface free energy of the resist film is preferably 32 to 40 mN/m, and more preferably 35 to 40 mN/m. The surface free energy of the resist film may be measured by the following method.

Specifically, the static contact angle of the film is calculated by the following method in a clean room (temperature: 23° C. (room temperature), humidity: 45%, pressure: normal pressure) using a contact angle meter ("DSA-10" manufactured by KRUS), for example. The position of the wafer stage is adjusted, and the wafer is placed on the stage. After injecting water into the needle, the position of the needle is finely adjusted (initial position). Next, water is discharged from the needle to form a water droplet (5 µl) on the wafer, and the needle is withdrawn from the water droplet. The contact angle is then measured, and taken as the static contact angle (°) with water. The static contact angle is also measured using methylene iodide instead of water, and taken as the static contact angle (°) with methylene iodide. The surface free energy (mN/m) is calculated from the measured static contact angle using the following method. The surface free energy γ is divided into the dispersion term γd and the polar term γp (see the following expression).

$$\gamma = \gamma d + \gamma p$$

The following expression is derived using Fawkes' equation, Young's equation, and Dupre's equation where γL is the surface free energy of the liquid, γdL is the dispersion term of the surface free energy of the liquid, γpL is the polar term of the surface free energy of the liquid, γS is the surface free energy of the solid, γdS is the dispersion term of the surface free energy of the solid, γpS is the polar term of the surface free energy of the solid, and θ is the static contact angle.

$$(\gamma dL + \gamma pL) \times (1 + \cos \theta) = 2\sqrt{(\gamma dS \times \gamma pL)} + 2\sqrt{(\gamma pS \times \gamma dL)}$$

Two expressions are derived using the surface free energy (72.8 mN/m (dispersion term: 21.8 mN/m, polar term: 51.0 mN/m)) of water and the surface free energy (50.8 mN/m (dispersion term: 48.3 mN/m, polar term: 2.5 mN/m)) of methylene iodide. The dispersion term γdS (unknown) and the polar term γpS (unknown) of the surface free energy of the solid are derived by solving the simultaneous equations, and added to calculate the surface free energy γS. Note that the surface free energy of the solid can be calculated by measuring the contact angle using two liquids for which the dispersion term and the polar term are known, and the liquids that may be used to measure the contact angle are not limited to water and methylene iodide.

A resist pattern-forming radiation-sensitive resin composition described later may be used as the radiation-sensitive resin composition. The thickness of the film is preferably about 10 to about 500 nm. The PB temperature is determined depending on the components (composition) of the radiation-sensitive resin composition, but is preferably about 30 to about 200° C., and more preferably 50 to 150° C. The PB time is normally 180 seconds or less. Note that the underlayer antireflective film may be formed on the surface of the substrate using an underlayer antireflective film-forming material, for example.

Step (2)

In the step (2), the resist film formed by the step (1) is exposed by applying radiation (optionally via an immersion medium such as water). In this case, radiation is applied via a mask having a given pattern. Radiation used for exposure is appropriately selected from visible rays, ultraviolet rays, deep ultraviolet rays, X-rays, charged particle rays, and the like, depending on the line width of the target pattern. Among these, deep ultraviolet rays are preferable. It is more preferable to use ArF excimer laser light (wavelength: 193 nm) or KrF excimer laser light (wavelength: 248 nm). It is particularly preferable to use ArF excimer laser light. The exposed photoresist film is subjected to post-exposure bake (PEB) to deprotect the polymer due to an acid generated by an acid generator in the exposed area of the resist film. The PEB temperature is appropriately adjusted depending on the components (composition) of the radiation-sensitive resin composition, but is normally 30 to 200° C., and preferably 50 to 170° C. The PEB time is normally 180 seconds or less.

Step (3)

In the step (3), the exposed resist film is developed using a developer to form a given resist pattern. The developed resist film (pattern) is normally rinsed with water, and dried. An alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water is preferably used as the developer.

When employing liquid immersion lithography, a protective film that is insoluble in the immersion liquid may be formed on the resist film before the step (2) so that the immersion liquid does not come in direct contact with the resist film. A solvent removal-type protective film that is removed by a solvent prior to the step (3) (see Japanese Patent Application Publication (KOKAI) No. 2006-227632, for example), or a developer removal-type protective film that is removed during development in the step (3) (see WO2005-069076 and WO2006-035790, for example) may be used as the protective film. It is preferable to use the developer removal-type protective film from the viewpoint of throughput.

The resulting resist pattern has an excellent pattern shape, and may suitably used for microfabrication that utilizes lithographic technology.

Resist Pattern-Forming Radiation-Sensitive Resin Composition

A resist pattern-forming radiation-sensitive resin composition according to one embodiment of the invention forms a resist film having a surface free energy of 30 to 40 mN/m. The resist pattern-forming radiation-sensitive resin composition may suitably be used to form a resist pattern, and may particularly suitably be used for liquid immersion lithography. Note that the resist film is formed using the resist pattern-forming radiation-sensitive resin composition under the following conditions. Specifically, a film is formed on a substrate (wafer) using the resist pattern-forming radiation-sensitive resin composition. More specifically, a film (thickness: 75 nm) is formed on an 8-inch silicon wafer by applying the radiation-sensitive resin composition at 1500 rpm in a clean room (temperature: 23° C. (room temperature), humidity: 45%, pressure: normal pressure) utilizing a coater/developer "Clean Track Act 8" (manufactured by Tokyo Electron Ltd.), and soft-baked (SB) at 120° C. for 60 seconds.

It is preferable that the resist pattern-forming radiation-sensitive resin composition according to one embodiment of the invention include the fluorine atom-containing polymer [A] and the acid generator [C]. The resist pattern-forming radiation-sensitive resin composition may preferably include the polymer [B] and the acid diffusion controller [D]. The resist pattern-forming radiation-sensitive resin composition may include an additional optional component as long as the advantageous effects of the invention are not impaired. Each component is described in detail below.

Fluorine Atom-Containing Polymer [A]

It is preferable that the fluorine atom-containing polymer [A] include at least one structural unit selected from the group consisting of the structural unit (a1) that includes an alkali-labile group, the structural unit (a2) that includes an acid-labile group, the structural unit (a3) that does not include an alkali-labile group, but includes a fluorine atom, a structural unit (a4) that includes a polar group, and a structural unit (a5) that includes a lactone structure, a sultone structure, or a cyclic carbonate structure. Note that the fluorine atom-containing polymer [A] may further include an additional structural unit other than the structural units (a1) to (a5). Note that the fluorine atom-containing polymer [A] may include two or more types of each structural unit. Each structural unit is described in detail below.

The fluorine atom content in the fluorine atom-containing polymer [A] is higher than that of the polymer [B] (described later). The fluorine atom-containing polymer [A] has a fluorine atom content higher than that of the polymer [B] (described later). The fluorine atom content may be determined by $^{13}$C-NMR analysis. When the fluorine atom content in the fluorine atom-containing polymer [A] is within the above range, the fluorine atom-containing polymer [A] and the surface of a resist film formed using a radiation-sensitive resin composition that includes the fluorine atom-containing polymer [A] exhibit improved water repellency. This makes it unnecessary to form an upper layer film when performing liquid immersion lithography. It is considered that the water repellency of the surface of the resist film can be improved since the fluorine atom-containing polymer [A] has low surface free energy and exhibits water repellency.

Structural Unit (a1)

The structural unit (a1) is a structural unit that includes an alkali-labile group. Examples of the structural unit (a1) include a structural unit that includes a functional group represented by the following formula (x) (hereinafter may be referred to as "functional group (x)").

wherein A is an oxygen atom (excluding an oxygen atom that is bonded directly to an aromatic ring, a carbonyl group, or a sulfoxyl group), an imino group, —CO—O—*, or —SO$_2$—O—* (wherein "*" is a bonding site (hand) to which R$^1$ is bonded). Specifically, the functional group (x) has a structure in which a hydroxyl group, an amino group, a carboxyl group, or a sulfoxyl group is modified with an alkali-labile group.

R$^1$ in the formula (x) is an alkali-labile group. The term "alkali-labile group" used herein refers to a group that substitutes a hydrogen atom of a polar functional group, and dissociates in the presence of an alkali.

The functional group (x) undergoes the following reaction with an alkaline aqueous solution to produce a polar group. Since the alkali-labile group included in the functional group (x) dissociates due to hydrolysis during alkali development to produce a polar group, affinity to the alkaline developer during alkali development can be improved. This makes it possible to effectively increase the scan speed, and suppress occurrence of defects. It is also possible to form a resist film that exhibits an excellent pattern shape after development and the like as compared with the case of using a functional group that produces a phenolic hydroxyl group during alkali development.

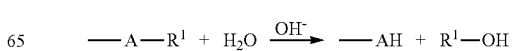

The alkali-labile group is not particularly limited as long as the alkali-labile group has the above properties. Examples of the alkali-labile group when A in the formula (x) is an oxygen atom or an imino group include a group represented by the following formula (R1-1).

(R1-1)

wherein $R^8$ is a hydrocarbon group having 1 to 10 carbon atoms in which some or all of the hydrogen atoms are substituted with a fluorine atom.

The hydrocarbon group having 1 to 10 carbon atoms represented by $R^8$ in which some or all of the hydrogen atoms are substituted with a fluorine atom, is preferably a linear or branched alkyl group having 1 to 10 carbon atoms in which some or all of the hydrogen atoms are substituted with a fluorine atom, or an alicyclic hydrocarbon group having 3 to 10 carbon atoms in which some or all of the hydrogen atoms are substituted with a fluorine atom.

Examples of the alkyl group include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, a 3-(3-methylpentyl) group, and the like.

Examples of the alicyclic hydrocarbon group include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group, a cycloheptyl group, a cycloheptylmethyl group, a 1-(1-cycloheptylethyl) group, a 1-(2-cycloheptylethyl) group, a 2-norbornyl group, and the like.

$R^8$ is more preferably a linear or branched perfluoroalkyl group having 1 to 10 carbon atoms obtained by substituting all of the hydrogen atoms of the hydrocarbon group with a fluorine atom, and particularly preferably a trifluoromethyl group.

The functional group (x) may be formed by fluoroacylation of an alcohol, an amine, or a carboxylic acid using a known method. For example, the functional group (x) may be formed by 1) esterification (condensation) of an alcohol and a fluorocarboxylic acid in the presence of an acid, 2) esterification (condensation) of an alcohol and a fluorocarboxylic acid halide in the presence of a base, or the like.

Examples of the alkali-labile group represented by $R^1$ when A in the formula (x) is —CO—O—* include groups represented by the following formulas (R1-2) to (R1-4).

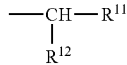

(R1-2)

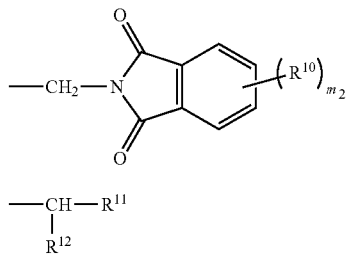

(R1-3)

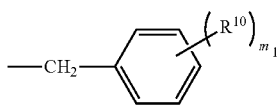

(R1-4)

In the formulas (R1-2) and (R1-3), $R^{10}$ is a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, $m_1$ is an integer from 0 to 5, and $m_2$ is an integer from 0 to 4, provided that a plurality of $R^{10}$ are either identical or different when $m_1$ or $m_2$ is an integer equal to or larger than 2.

In the formulas (R1-4), $R^{11}$ and $R^{12}$ are independently a hydrogen atom or an alkyl group having 1 to 10 carbon atoms, and may bond to each other to form an alicyclic structure having 4 to 20 carbon atoms together with the carbon atom to which $R^{11}$ and $R^{12}$ are bonded.

Examples of the halogen atom represented by $R^{10}$ include a fluorine atom, a chlorine atom, a bromine atom, an iodine atom, and the like. Among these, a fluorine atom is preferable.

Examples of the alkyl group having 1 to 10 carbon atoms represented by $R^{10}$ include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, a 3-(3-methylpentyl) group, and the like.

Examples of the alkoxy group having 1 to 10 carbon atoms represented by $R^{10}$ include a methoxy group, an ethoxy group, an n-butoxy group, a t-butoxy group, a propoxy group, an isopropoxy group, and the like.

Examples of the acyl group having 1 to 10 carbon atoms represented by $R^{10}$ include an acetyl group, an ethylcarbonyl group, a propylcarbonyl group, and the like.

Examples of the acyloxy group having 1 to 10 carbon atoms represented by $R^{10}$ include an acetoxy group, an ethynyloxy group, a butynyloxy group, a t-butynyloxy group, a t-amyloxy group, an n-hexanecarbonyloxy group, an n-octanecarbonyloxy group, and the like.

Examples of the alkyl group having 1 to 10 carbon atoms represented by $R^{11}$ or $R^{12}$ include those mentioned above in connection with the alkyl group having 1 to 10 carbon atoms represented by $R^{10}$, and the like.

Examples of the alicyclic structure having 4 to 20 carbon atoms formed by $R^{11}$ and $R^{12}$ together with the carbon atom to which $R^{11}$ and $R^{12}$ are bonded, include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group, a cycloheptyl group, a cycloheptylmethyl group, a 1-(1-cycloheptylethyl) group, a 1-(2-cycloheptylethyl) group, a 2-norbornyl group, and the like.

Specific examples of the group represented by the formula (R1-4) include a methyl group, an ethyl group, a 1-propyl group, a 2-propyl group, a 1-butyl group, a 2-butyl group, a 1-pentyl group, a 2-pentyl group, a 3-pentyl group, a 1-(2-methylbutyl) group, a 1-(3-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(3-methylpentyl) group, a 2-(4-methylpentyl) group, a 3-(2-methylpentyl) group, and the like. Among these, a methyl group, an ethyl group, a 1-propyl group, a 2-propyl group, a 1-butyl group, and a 2-butyl group are preferable.

Examples of a structural unit that includes the functional group (x) include a structural unit represented by the following formula (c-1) (hereinafter may be referred to as "structural unit (c-1)"). The structural unit (c-1) has a structure in which the functional group (x) is bonded to the main chain via $X^1$, $R^2$, $R^3$, and E.

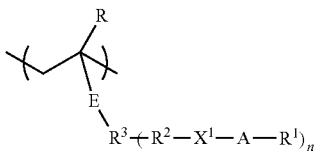
(c-1)

wherein $R^1$ is an alkali-labile group, A is an oxygen atom, an imino group, —CO—O—*, —CO—O—*, or —SO$_2$—O—*, "*" is a bonding site (hand) to which $R^1$ is bonded, $R^2$ is a single bond, a methylene group, a linear or branched alkylene group having 2 to 10 carbon atoms, or a cyclic hydrocarbon group having 4 to 20 carbon atoms, $X^1$ is a single bond, a difluoromethylene group, or a linear or branched perfluoroalkylene group having 2 to 20 carbon atoms, $R^3$ is a single bond, or an (n+1)-valent hydrocarbon group having 1 to 20 carbon atoms, and includes a structure in which an oxygen atom, a sulfur atom, an imino group, a carbonyl group, —CO—O—, or —CO—NH— is bonded between the carbon atoms of the hydrocarbon group, or bonded to the end of $R^3$ that is bonded to $R^2$, E is an oxygen atom, —CO—O—*, or —CO—NH—*, "*" is a bonding site (hand) to which $R^3$ is bonded, R is a hydrogen atom, a methyl group, or a trifluoromethyl group, and n is an integer from 1 to 3, provided that a plurality of $R^1$, a plurality of $R^2$, a plurality of $X^1$, and a plurality of A are respectively either identical or different when n is 2 or 3.

Examples of $X^1$ include a group represented by the following formula (X-1).

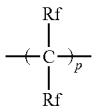
(X-1)

wherein p is an integer from 1 to 4, and Rf are independently a fluorine atom or a perfluoroalkyl group having 1 to 10 carbon atoms.

Examples of the structure represented by the formula (X-1) include the structures represented by the following formulas (X-2) and (X-3).

(X-2)

(X-3)

In the formula (c-1), $R^3$ is a single bond or an (n+1)-valent hydrocarbon group having 1 to 20 carbon atoms, and includes a structure in which an oxygen atom, a sulfur atom, an imino group, a carbonyl group, —CO—O—, or —CO—NH— is bonded between the carbon atoms of the hydrocarbon group, or bonded to the end of $R^3$ that is bonded to $R^2$, and n is an integer from 1 to 3. Therefore, the structural unit (c-1) includes one, two, or three functional groups (x). A plurality of $R^1$, a plurality of $R^2$, and a plurality of A are either identical or different when n is 2 or 3. Specifically, a plurality of functional groups (x) may have either an identical or different structure when n is 2 or 3. When n is 2 or 3, a plurality of functional groups (x) may be bonded to an identical carbon atom of $R^2$, or may be bonded to different carbon atoms of $R^2$.

Examples of a chain-like structure represented by $R^3$ include an (n+1)-valent hydrocarbon group obtained by removing (n+1) hydrogen atoms from a chain-like hydrocarbon having 1 to 10 carbon atoms (e.g., methane, ethane, propane, butane, 2-methylpropane, pentane, 2-methylbutane, 2,2-dimethylpropane, hexane, heptane, octane, nonane, or decane), and the like.

Examples of a cyclic structure represented by $R^3$ include an (n+1)-valent hydrocarbon group obtained by removing (n+1) hydrogen atoms from an alicyclic hydrocarbon (e.g., cyclobutane, cyclopentane, cyclohexane, bicyclo[2.2.1]heptane, bicyclo[2.2.2]octane, tricyclo[5.2.1.0$^{2,6}$]decane, or tricyclo[3.3.1.1$^{3,7}$]decane); an (n+1)-valent hydrocarbon group obtained by removing (n+1) hydrogen atoms from an aromatic hydrocarbon (e.g., benzene or naphthalene); and the like.

Examples of the structure in which an oxygen atom, a sulfur atom, an imino group, a carbonyl group, —CO—O—, or —CO—NH— is bonded to the end of $R^3$ that is bonded to $R^2$ include structures represented by the following formulas.

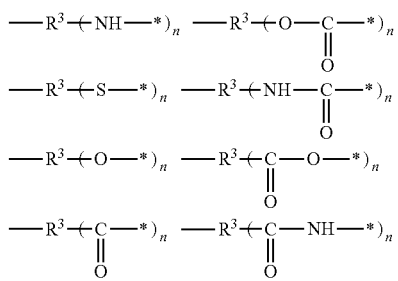

Further examples of $R^3$ include a structure in which an oxygen atom, a sulfur atom, an imino group, a carbonyl group, —CO—O—, or —CO—NH— is bonded between the carbon atoms of a cyclic hydrocarbon group, a structure that further includes at least one group selected from group consisting of —CO—, —COO—, —COO—, —O—, —NR—, —CS—, —S—, —SO—, and —SO$_2$—, and the like.

Examples of a cyclic structure formed by an oxygen atom and a hydrocarbon group having 1 to 20 carbon atoms include a cyclic ether structure having 3 to 8 carbon atoms, and the like.

Examples of a cyclic structure formed by a sulfur atom and a hydrocarbon group having 1 to 20 carbon atoms include a cyclic thioether structure having 3 to 8 carbon atoms, and the like.

Examples of a cyclic structure formed by an imino group and a hydrocarbon group having 1 to 20 carbon atoms include a cyclic amine structure having 3 to 8 carbon atoms, and the like.

Examples of a cyclic structure formed by a carbonyl group and a hydrocarbon group having 1 to 20 carbon atoms include a cyclic ketone structure having 3 to 8 carbon atoms, and the like.

Examples of a cyclic structure formed by —CO—O— and a hydrocarbon group having 1 to 20 carbon atoms include a lactone structure having 3 to 8 carbon atoms, and the like.

Examples of a cyclic structure formed by —CO—NH— and a hydrocarbon group having 1 to 20 carbon atoms include a cyclic amide structure having 3 to 8 carbon atoms, and the like.

Examples of the divalent linear or branched saturated or unsaturated hydrocarbon group having 1 to 20 carbon atoms represented by $R^2$ in the formula (c-1) include divalent hydrocarbon groups derived from a linear or branched alkyl group having 1 to 20 carbon atoms (e.g., methyl group, ethyl group, n-propyl group, i-propyl group, n-butyl group, 2-methylpropyl group, 1-methylpropyl group, t-butyl group, pentyl group, isopentyl group, neopentyl group, hexyl group, heptyl group, octyl group, nonyl group, or decyl group), and the like.

Examples of the divalent cyclic saturated or unsaturated hydrocarbon group include groups derived from an alicyclic hydrocarbon having 3 to 20 carbon atoms or an aromatic hydrocarbon, and the like. Specific examples of the alicyclic hydrocarbon include cycloalkanes such as cyclobutane, cyclopentane, cyclohexane, bicyclo[2.2.1]heptane, bicyclo[2.2.2]octane, tricyclo[5.2.1.0$^{2,6}$]decane, tricyclo[3.3.1.1$^{3,7}$]decane, and tetracyclo[6.2.1.1$^{3,6}$.0$^{2,7}$]dodecane, and the like. Specific examples of the aromatic hydrocarbon include benzene, naphthalene, and the like.

The hydrocarbon group represented by $R^2$ in the formula (c-1) may be a group in which at least one hydrogen atom is substituted with one or two or more of a linear, branched, or cyclic alkyl group having 1 to 12 carbon atoms, such as a methyl group, an ethyl group, an n-propyl group, an i-propyl group, an n-butyl group, a 2-methylpropyl group, a 1-methylpropyl group, and a t-butyl group, a hydroxyl group, a cyano group, a hydroxyalkyl group having 1 to 10 carbon atoms, a carboxyl group, an oxygen atom, and the like.

In the formula (c-1), R is a hydrogen atom, a methyl group, or a trifluoromethyl group, and E is an oxygen atom, —CO—O—*, or —CO—NH—* (wherein "*" is a bonding site (hand) to which $R^3$ is bonded). It is preferable that E be —OO-O-*. Specifically, it is preferable that the fluorine atom-containing polymer [A] include a structural unit represented by the following formula (c-1a) (hereinafter may be referred to as "structural unit (c-1a)") as the structural unit (c-1).

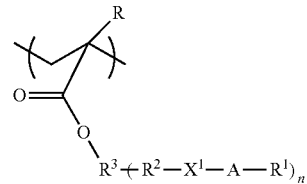

wherein R, $R^1$, $R^2$, $R^3$, A, $X^1$, and n are the same as defined for the formula (c-1).

Examples of the structural unit (c-1a) include a structural unit represented by the following formula (c-1a-1) (hereinafter may be referred to as "structural unit (c-1a-1)") and a structural unit represented by the following formula (c-1a-2) (hereinafter may be referred to as "structural unit (c-1a-2)").

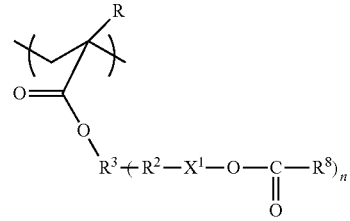

wherein R, $R^2$, $R^3$, $X^1$, and n are the same as defined for the formula (c-1), and $R^8$ is the same as defined for the formula (R1-1).

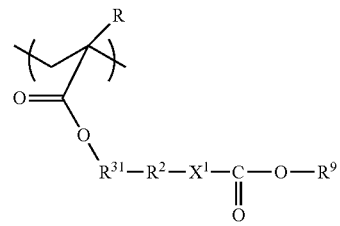

wherein R, $R^2$, and $X^1$ are the same as defined for the formula (c-1), $R^{31}$ is a methylene group, a linear or branched hydrocarbon group having 2 to 10 carbon atoms, or a divalent cyclic hydrocarbon group having 4 to 20 carbon atoms, and includes a structure in which an oxygen atom, a sulfur atom, an imino group, a carbonyl group, —CO—O—, or —CO—NH— is bonded to the end of $R^{31}$ that is bonded to $R^2$, and $R^9$ is a group among groups represented by formulas (1) to (3).

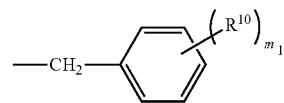

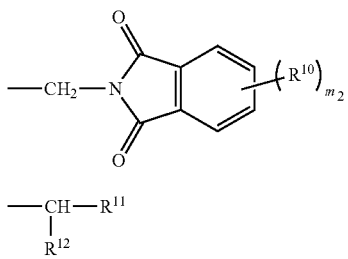

(2)

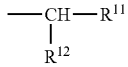

(3)

wherein $R^{10}$ is a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, provided that a plurality of $R^{10}$ are either identical or different when a plurality of $R^{10}$ are present, $m_1$ is an integer from 0 to 5, $m_2$ is an integer from 0 to 4, and $R^{11}$ and $R^{12}$ are independently a hydrogen atom or an alkyl group having 1 to 10 carbon atoms, and may bond to each other to form an alicyclic structure having 4 to 20 carbon atoms.

Specific examples of the group represented by $R^{31}$ include those mentioned above in connection with $R^3$ when n=1.

Specific examples of the structural unit (c-1a-1) include structural units represented by the following formulas (c-1a-1a) and (c-1a-1b).

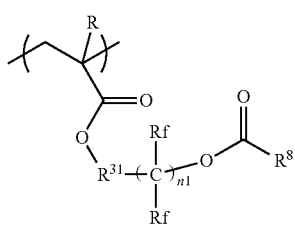

(c-1a-1a)

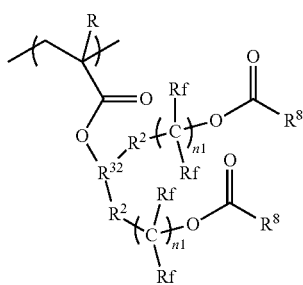

(c-1a-1b)

wherein R is the same as defined for the formula (c-1), $R^8$ is the same as defined for the formula (R1-1), n1 is (or are independently) an integer from 0 to 4, Rf are independently a fluorine atom or a perfluoroalkyl group having 1 to 10 carbon atoms, and are preferably a fluorine atom or a trifluoromethyl group, $R^2$ is the same as defined for the formula (c-1), $R^{31}$ is the same as defined for the formula (c-1a-2), and $R^{32}$ is a trivalent linear or branched hydrocarbon group having 1 to 10 carbon atoms or a trivalent cyclic hydrocarbon group having 4 to 20 carbon atoms, provided that an oxygen atom, a sulfur atom, a carbonyl group, or an imino group may be bonded to the end of $R^{32}$ that is bonded to $R^2$. Specific examples of the group represented by $R^{32}$ include those mentioned above in connection with $R^3$ when n=2.

When n1 in the formulas (c-1a-1a) and (c-1a-1b) is an integer equal to or larger than 1, an OH group that has a fluorine atom or a perfluoroalkyl group at the α-position is produced due to a reaction with an alkaline aqueous solution. Such an OH group has a low pKa as compared with an alcoholic OH group, and improves hydrophilicity.

Specific examples of the structural unit represented by the formula (c-1a-1a) include structural units represented by the following formulas (c-1a-1c) to (c-1a-1f). Specific examples of the structural unit represented by the formula (c-1a-1b) include structural units represented by the following formulas (c-1a-1g) to (c-1a-1 h).

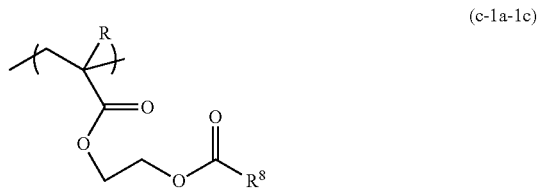

(c-1a-1c)

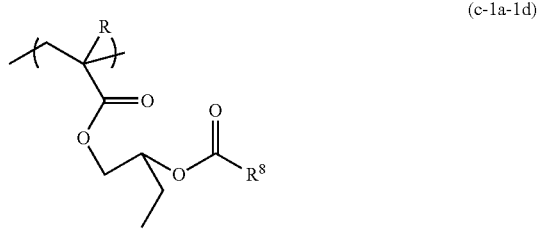

(c-1a-1d)

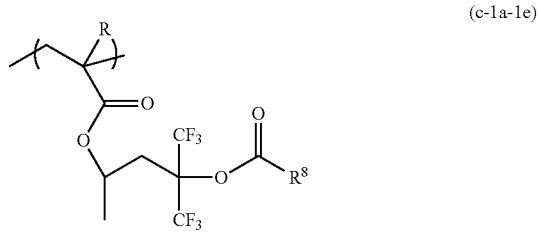

(c-1a-1e)

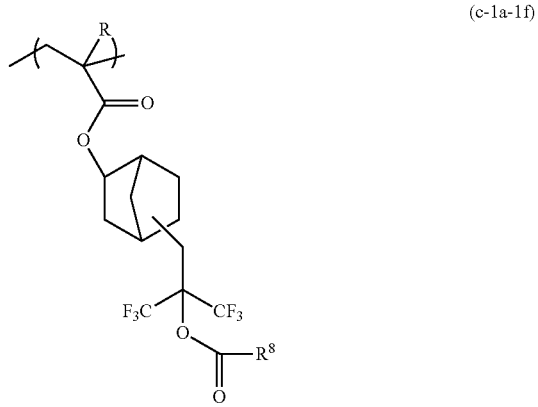

(c-1a-1f)

-continued

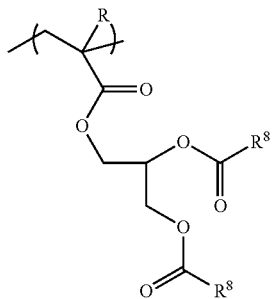
(c-1a-1g)

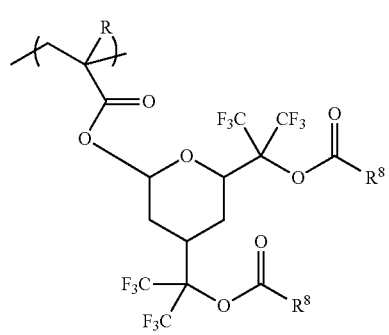
(c-1a-1h)

wherein $R^8$ is the same as defined for the formula (R1-1), and R is the same as defined for the formula (c-1).

Specific examples of the structural unit (c-1a-2) include structural units represented by the following formulas (c-1a-2a) and (c-1a-2b).

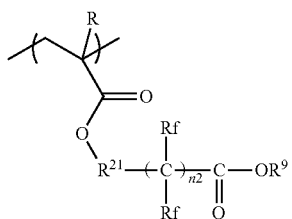
(c-1a-2a)

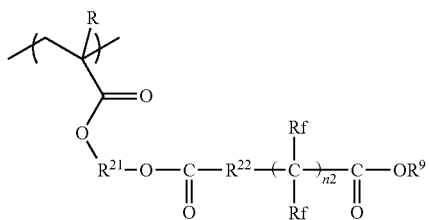
(c-1a-2b)

wherein R is the same as defined for the formula (c-1), $R^9$ is the same as defined for the formula (c-1a-2), n2 is an integer from 0 to 4, Rf are independently a fluorine atom or a perfluoroalkyl group having 1 to 10 carbon atoms, and are preferably a fluorine atom or a trifluoromethyl group, $R^{21}$ is a methylene group, a linear or branched alkylene group having 2 to 10 carbon atoms, or a divalent cyclic hydrocarbon group having 4 to 20 carbon atoms, and $R^{22}$ is a single bond, a methylene group, a linear or branched alkylene group having 2 to 10 carbon atoms, or a divalent cyclic hydrocarbon group having 4 to 20 carbon atoms.

When n2 in the formulas (c-1a-2a) and (c-1a-2b) is an integer equal to or larger than 1, a fluorine atom or a perfluoroalkyl group is present at the α-position of the carbonyloxy group, and the reactivity with an alkaline aqueous solution is considered to be improved. A COOH group produced due to hydrolysis of the alkali-labile group has a low pKa, and improves hydrophilicity.

Specific examples of the structural unit represented by the formula (c-1a-2a) include structural units represented by the following formulas (c-1a-2e) and (c-1a-2f). Specific examples of the structural unit represented by the formula (c-1a-2b) include structural units represented by the following formulas (c-1a-2c) and (c-1a-2d).

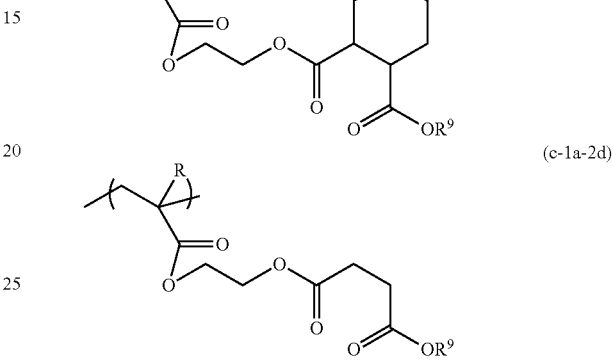
(c-1a-2c)

(c-1a-2d)

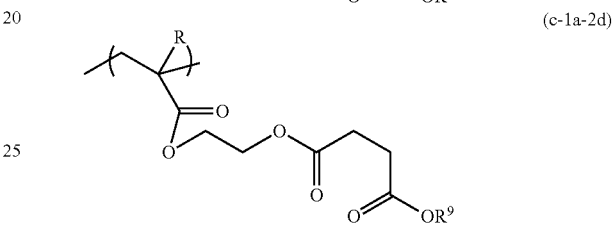
(c-1a-2e)

(c-1a-2f)

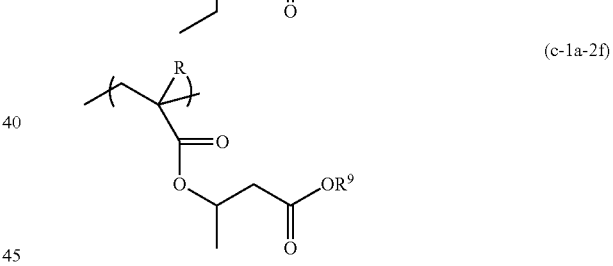

wherein R is the same as defined for the formula (c-1), and $R^9$ is the same as defined for the formula (c-1a-2).

Further examples of the structural unit that includes the functional group (x) include a structural unit represented by the following formula.

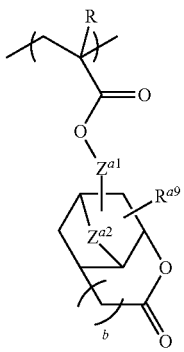

wherein $R^{a6}$ is a hydrogen atom, a fluorine atom, a methyl group, or a trifluoromethyl group, $R^{a9}$ is a hydrogen atom, a trifluoroethoxycarbonyl group, or a hexafluoroisopropoxycarbonyl group, $Z^{a1}$ is a single bond or a methylene group, $Z^{a2}$ is a methylene group or an oxygen atom, and b is 0 or 1.

Specific examples of the structural unit represented by the above formula include structural units represented by the following formulas.

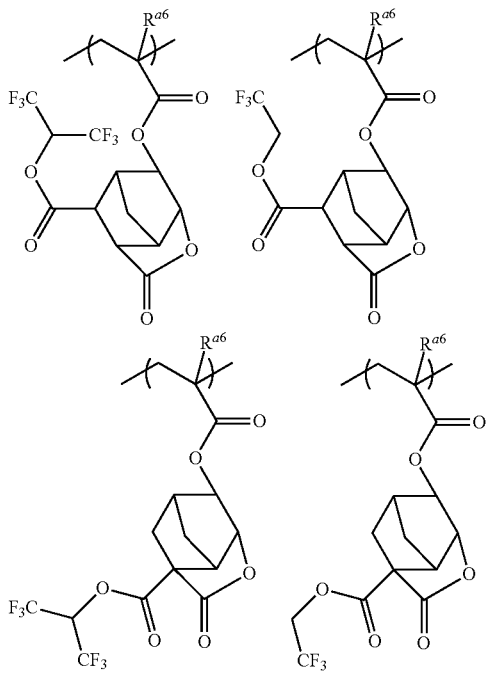

wherein $R^{a6}$ is a hydrogen atom, a fluorine atom, a methyl group, or a trifluoromethyl group.

The content of the structural unit (a1) (that includes an alkali-labile group) in the fluorine atom-containing polymer [A] is preferably 5 mol % or more, more preferably 10 to 90 mol %, and particularly preferably 40 to 90 mol %, based on the total structural units included in the fluorine atom-containing polymer [A]. If the content of the repeating unit (a1) is less than 5 mol %, defects may occur due to a deterioration in developability.

Structural Unit (a2) that Includes Acid-Labile Group

Examples of the structural unit (a2) that includes an acid-labile group include a structural unit represented by the following formula (5).

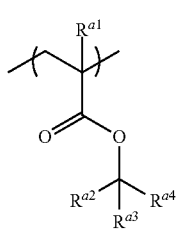

(5)

wherein $R^{a1}$ is a hydrogen atom or a methyl group, and $R^{a2}$ to $R^{a4}$ are independently an alkyl group having 1 to 4 carbon atoms or an alicyclic hydrocarbon group having 4 to 20 carbon atoms, provided that $R^{a3}$ and $R^{a4}$ may bond to each other to form a divalent alicyclic hydrocarbon group having 4 to 20 carbon atoms together with the carbon atom to which $R^{a3}$ and $R^{a4}$ are bonded.

Examples of the alkyl group having 1 to 4 carbon atoms include a methyl group, an ethyl group, an n-propyl group, an i-propyl group, an n-butyl group, a 2-methylpropyl group, a 1-methylpropyl group, a t-butyl group, and the like.

Examples of the alicyclic group having 4 to 20 carbon atoms, and the alicyclic group having 4 to 20 carbon atoms formed by $R^{a3}$ and $R^{a4}$ together with the carbon atom to which $R^{a3}$ and $R^{a4}$ are bonded, include polyalicyclic groups that include a bridged skeleton (e.g., adamantane skeleton or norbornane skeleton), and monoalicyclic groups that include a cycloalkane skeleton (e.g., cyclopentane skeleton or cyclohexane skeleton). These groups may be substituted with one or more linear, branched, or cyclic alkyl groups having 1 to 10 carbon atoms, for example.

Structural units represented by the following formulas are preferable as the structural unit (a2).

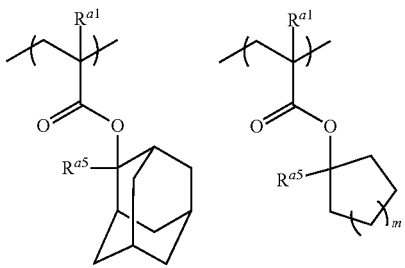

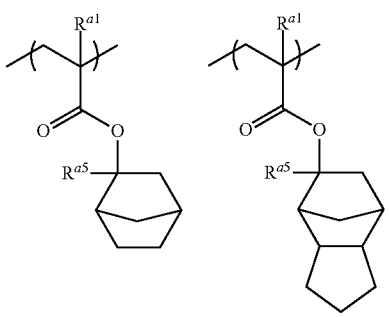

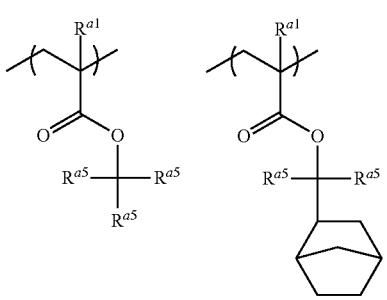

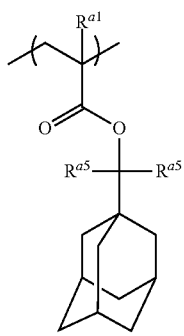
wherein $R^{a1}$ is the same as defined for the formula (5), $R^{a5}$ is an alkyl group having 1 to 4 carbon atoms, and m is an integer from 1 to 6.
Among these, structural units represented by the following formulas (5-1) to (5-20) are more preferable, and the structural units represented by the formulas (5-4) and (5-12) are still more preferable.
(5-1)
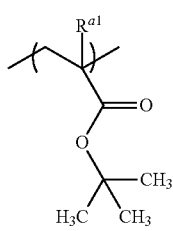
(5-2)
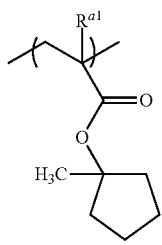
(5-3)
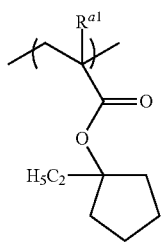
(5-4)
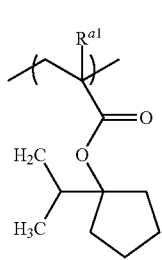
(5-5)
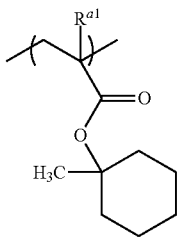
(5-6)
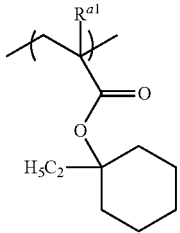
(5-7)
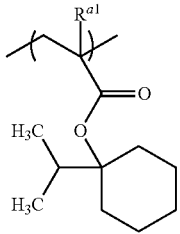
(5-8)
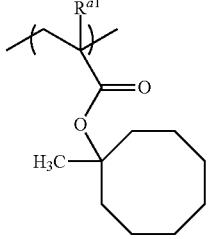
(5-9)
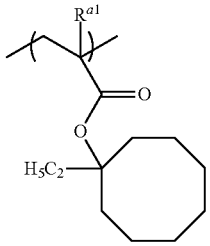
(5-10)
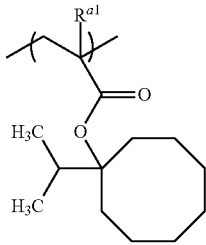

(5-11) 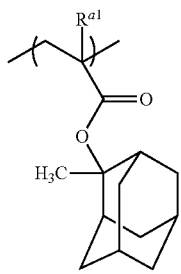
(5-12) 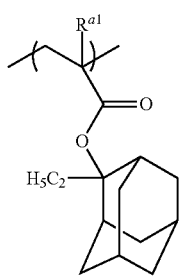
(5-13) 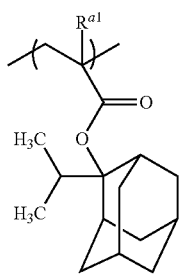
(5-14) 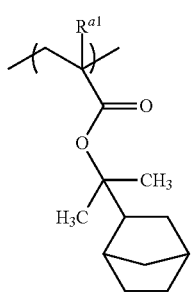
(5-15) 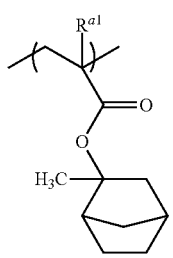
(5-16) 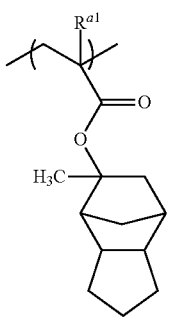
(5-17) 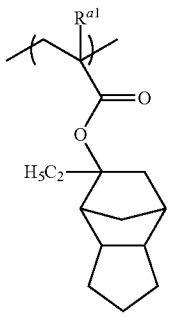
(5-18) 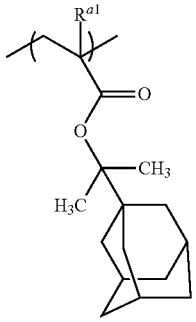
(5-19) 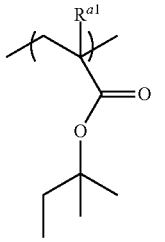
(5-20) 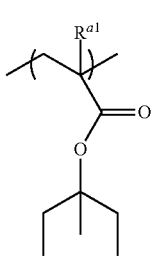
wherein $R^{a1}$ is the same as defined for the formula (5).
The content of the structural unit (a2) in the fluorine atom-containing polymer [A] is preferably 5 to 80 mol %, more preferably 10 to 80 mol %, and particularly preferably 10 to 60 mol %, based on the total structural units included in the fluorine atom-containing polymer [A]. If the content of the repeating unit (a2) exceeds 80 mol %, the scan capability may deteriorate, or defects may occur during liquid immersion lithography.

Examples of a monomer that produces the structural unit (a2) include bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tricyclo[3.3.1.1$^{3,7}$]dec-1-yl(meth)acrylate, tricyclo[3.3.1.1$^{3,7}$]dec-2-yl(meth)acrylate, and the like.
Structural Unit (a3)

Examples of the structural unit (a3) include a structural unit represented by the following formula.

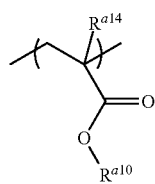

(6)

wherein $R^{a14}$ is a hydrogen atom, a fluorine atom, a methyl group, or a trifluoromethyl group, and $R^{a10}$ is a linear or branched alkyl group having 1 to 6 carbon atoms that is substituted with a fluorine atom, or a monovalent alicyclic hydrocarbon group having 4 to 20 carbon atoms that is substituted with a fluorine atom, provided that some or all of the hydrogen atoms of the alkyl group and the alicyclic hydrocarbon group may be substituted with a substituent.

Examples of the linear or branched alkyl group having 1 to 6 carbon atoms include a methyl group, an ethyl group, a propyl group, a butyl group, and the like.

Examples of the monovalent alicyclic hydrocarbon group having 4 to 20 carbon atoms include a cyclopentyl group, a cyclopentylpropyl group, a cyclohexyl group, a cyclohexylmethyl group, a cycloheptyl group, a cyclooctyl group, a cyclooctylmethyl group, and the like.

The structural unit (a3) represented by the formula (6) is preferably a structural unit represented by the following formula (6-1) or a structural unit represented by the following formula (6-2).

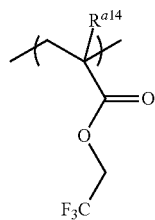

(6-1)

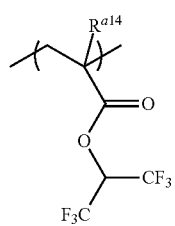

(6-2)

wherein $R^{a14}$ is the same as defined for the formula (6).

Examples of a monomer that produces the structural unit (a3) include trifluoromethyl(meth)acrylate, 2,2,2-trifluoroethyl(meth)acrylate, perfluoroethyl(meth)acrylate, perfluoro-n-propyl(meth)acrylate, perfluoro-1-propyl(meth)acrylate, perfluoro-n-butyl(meth)acrylate, perfluoro-1-butyl(meth)acrylate, perfluoro-t-butyl(meth)acrylate, perfluorocyclohexyl(meth)acrylate, 2-(1,1,1,3,3,3-hexafluoro)propyl(meth)acrylate, 1-(2,2,3,3,4,4,5,5-octafluoro)pentyl(meth)acrylate, 1-(2,2,3,3,4,4,5,5-octafluoro)hexyl(meth)acrylate, perfluorocyclohexylmethyl(meth)acrylate, 1-(2,2,3,3,3-pentafluoro)propyl(meth)acrylate, 1-(2,2,3,3,4,4,4-heptafluoro)pentyl(meth)acrylate, 1-(3,3,4,4,5,5,6,6,7,7,8,8,9,9,10,10,10-heptadecafluoro)decyl(meth)acrylate, 1-(5-trifluoromethyl-3,3,4,4,5,6,6,6-octafluoro)hexyl(meth)acrylate, and the like.

Further examples of the structural unit (a3) include a structural unit represented by the following formula (7).

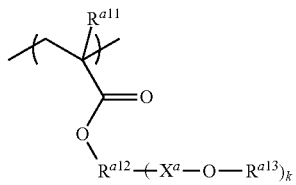

(7)

wherein $R^{a11}$ is a hydrogen atom, a methyl group, or a trifluoromethyl group, $R^{a12}$ is a (k+1)-valent linking group, $X^a$ is a divalent linking group that includes a fluorine atom, $R^{a13}$ is a hydrogen atom or a monovalent organic group, and k is an integer from 1 to 3, provided that a plurality of Xa and a plurality of $R^{a13}$ are respectively either identical or different when k is 2 or 3.

Examples of the (k+1)-valent linking group represented by $R^{a12}$ include linear or branched hydrocarbon groups having 1 to 30 carbon atoms, alicyclic hydrocarbon groups having 3 to 30 carbon atoms, aromatic hydrocarbon groups having 6 to 30 carbon atoms, and groups formed by combining these groups with one or more groups selected from the group consisting of an oxygen atom, a sulfur atom, an ether group, an ester group, a carbonyl group, an imino group, and an amide group. The (k+1)-valent linking group may be substituted with a substituent.

Examples of the linear or branched hydrocarbon groups having 1 to 30 carbon atoms include groups obtained by removing (k+1) hydrogen atoms from a hydrocarbon (e.g., methane, ethane, propane, butane, pentane, hexane, heptane, decane, icosane, and triacontane).

Examples of the alicyclic hydrocarbon groups having 3 to 30 carbon atoms include groups obtained by removing (m+1) hydrogen atoms from a monocyclic saturated hydrocarbon (e.g., cyclopropane, cyclobutane, cyclopentane, cyclohexane, cycloheptane, cyclooctane, cyclodecane, methylcyclohexane, and ethylcyclohexane), a monocyclic unsaturated hydrocarbon (e.g., cyclobutene, cyclopentene, cyclohexene, cycloheptene, cyclooctene, cyclodecene, cyclopentadiene, cyclohexadiene, cyclooctadiene, and cyclodecadiene), a polycyclic saturated hydrocarbon (e.g., bicyclo[2.2.1]heptane, bicyclo[2.2.2]octane, tricyclo[5.2.1.0$^{2,6}$]decane, tricyclo[3.3.1.1$^{3,7}$]decane, tetracyclo[6.2.1.1$^{3,6}$.0$^{2,7}$]dodecane, and adamantane), or a polycyclic unsaturated hydrocarbon (e.g., bicyclo[2.2.1]heptene, bicyclo[2.2.2]octene, tricyclo[5.2.1.0$^{2,6}$]decene, tricyclo[3.3.1.1$^{3,7}$]decene, and tetracyclo[6.2.1.1$^{3,6}$.0$^{2,7}$]dodecene), and the like.

Examples of the aromatic hydrocarbon groups having 6 to 30 carbon atoms include groups obtained by removing (m+1)

hydrogen atoms from an aromatic hydrocarbon (e.g., benzene, naphthalene, phenanthrene, anthracene, tetracene, pentacene, pyrene, picene, toluene, xylene, ethylbenzene, mesitylene, and cumene), and the like.

Examples of the divalent linking group represented by Xa that includes a fluorine atom include divalent linear hydrocarbon groups having 1 to 20 carbon atoms that include a fluorine atom. Examples of the structure represented by $X^a$ include the structures represented by the following formulas ($X^a$-1) to ($X^a$-6), and the like.

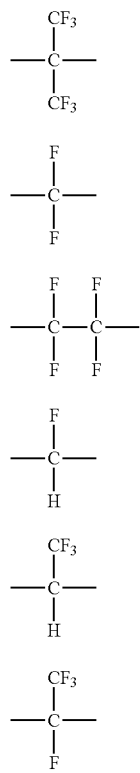

Among these, the structures represented by the formulas ($X^a$-1) and ($X^a$-2) are preferable.

Examples of the monovalent organic group represented by $R^{a13}$ include linear or branched hydrocarbon groups having 1 to 30 carbon atoms, alicyclic hydrocarbon groups having 3 to 30 carbon atoms, aromatic hydrocarbon groups having 6 to 30 carbon atoms, groups formed by combining these groups with one or more groups selected from the group consisting of an oxygen atom, a sulfur atom, an ether group, an ester group, a carbonyl group, an imino group, and an amide group, and the like.

Examples of the structural unit (a3) include a structural unit represented by the following formulas (7-1) and (7-2).

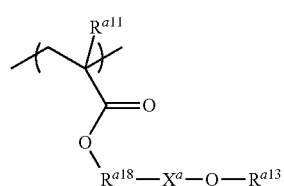

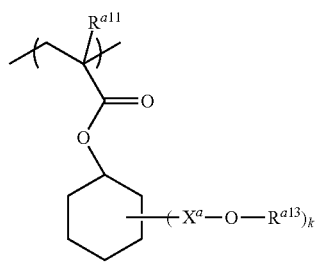

In the formula (7-1), $R^{a18}$ is a divalent linear, branched, or cyclic saturated or unsaturated hydrocarbon group having 1 to 20 carbon atoms, and $R^{a11}$, $X^a$, and $R^{a13}$ are the same as defined for the formula (7).

In the formula (7-2), $R^{a11}$, $X^a$ and $R^{a13}$ are the same as defined for the formula (7), provided that a plurality of $X^a$ and a plurality of $R^{a13}$ are respectively either identical or different when k is 2 or 3.

Examples of the structural units represented by the formulas (7-1) and (7-2) include structural units represented by the following formulas (7-1-1), (7-1-2), and (7-2-1).

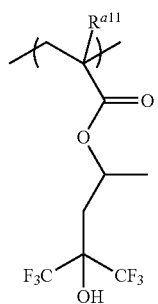

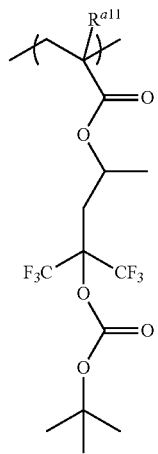

(7-2-1)

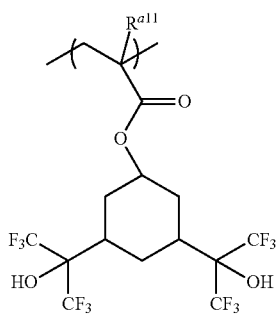

wherein $R^{a11}$ is the same as defined for the formula (7).

Examples of a monomer that produces the repeating unit (a3) include (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1] heptyl}(meth)acrylate, and the like.

The content of the structural unit (a3) in the fluorine atom-containing polymer [A] is preferably 2 to 70 mol %, and more preferably 2 to 30 mol %, based on the total structural units included in the fluorine atom-containing polymer [A]. If the content of the repeating unit (a3) is less than 2 mol %, defects may occur due to a deterioration in water repellency. Note that the fluorine atom-containing polymer [A] may include two or more types of the structural unit (a3).

The content of the structural unit that includes a fluorine atom in the fluorine atom-containing polymer [A] is preferably 20 to 90 mol %, more preferably 30 to 80 mol %, and still preferably 40 to 70 mol %, based on the total structural units included in the fluorine atom-containing polymer [A]. When the content of the structural unit that includes a fluorine atom is within the above range, the resulting resist film has more moderate surface free energy.

Structural Unit (a4) that Includes Polar Group

Examples of the structural unit (a4) that includes a polar group include structural units represented by the following formulas.

(a4-1)

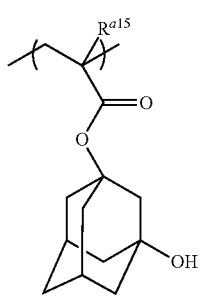

(a4-2)

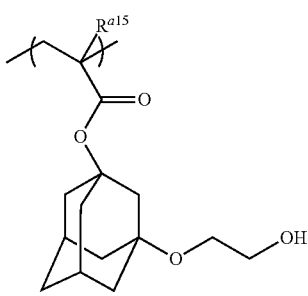

(a4-3)

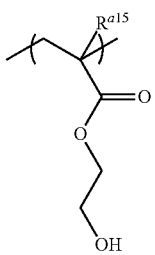

(a4-4)

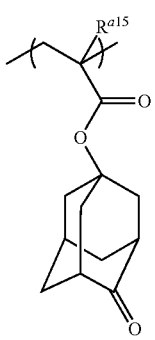

(a4-5)

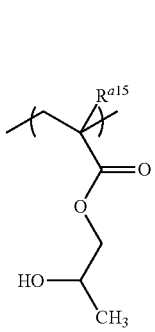

(a4-6)

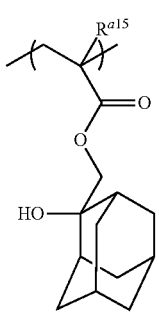

(a4-7)
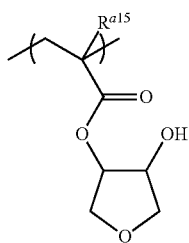

(a4-8)
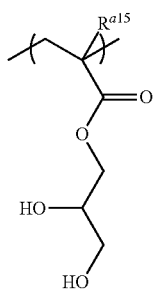

(a4-9)
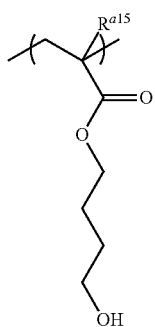

(a4-10)
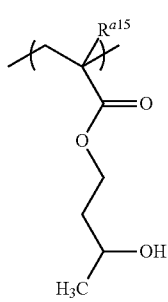

(a4-11)
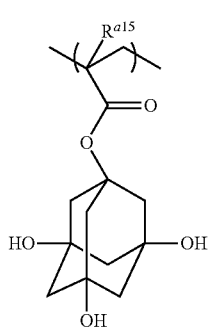

(a4-12)
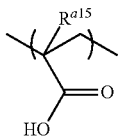

wherein $R^{a15}$ is a hydrogen atom, a fluorine atom, a methyl group, or a trifluoromethyl group.

Among these, the structural unit represented by the formula (a4-12) is preferable.

The content of the structural unit (a4) in the fluorine atom-containing polymer [A] is preferably 80 mol % or less, and more preferably 40 mol % or less, based on the total structural units included in the fluorine atom-containing polymer [A]. Note that the fluorine atom-containing polymer [A] may include two or more types of the structural unit (a4).

Structural Unit (a5) that Includes Lactone Structure, Sultone Structure, or Cyclic Carbonate Structure The fluorine atom-containing polymer [A] may further include the structural unit (a5) that includes a lactone structure, a sultone structure, or a cyclic carbonate structure. When the fluorine atom-containing polymer [A] includes the structural unit (a5), the resulting resist film exhibits improved adhesion to the substrate.

Examples of the structural unit (a5) include structural units represented by the following formulas.

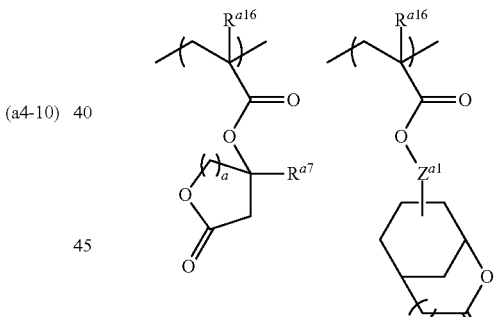

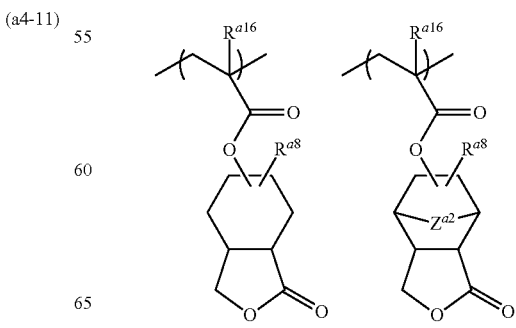

-continued

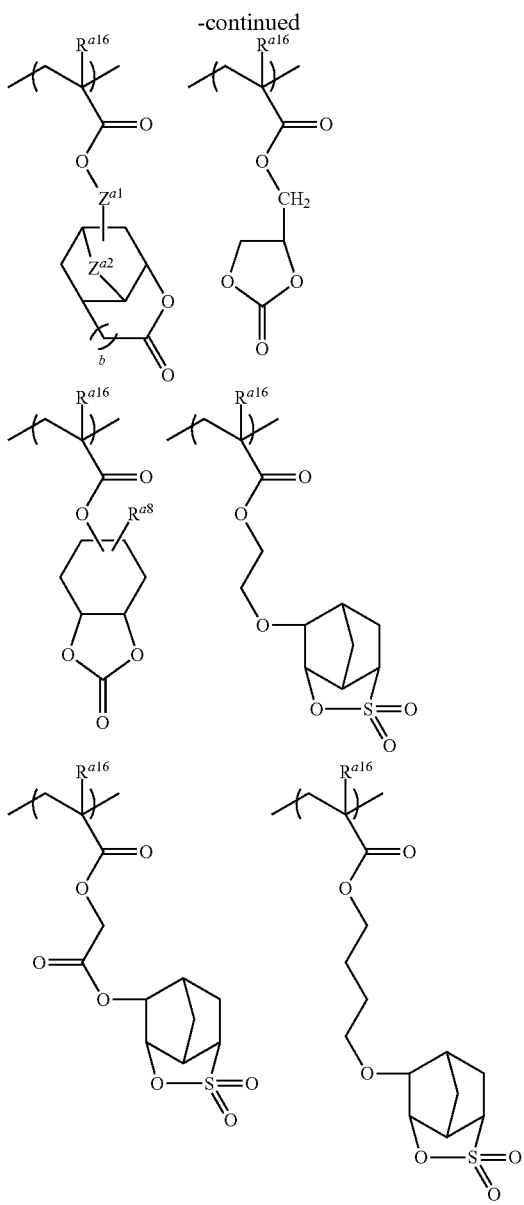

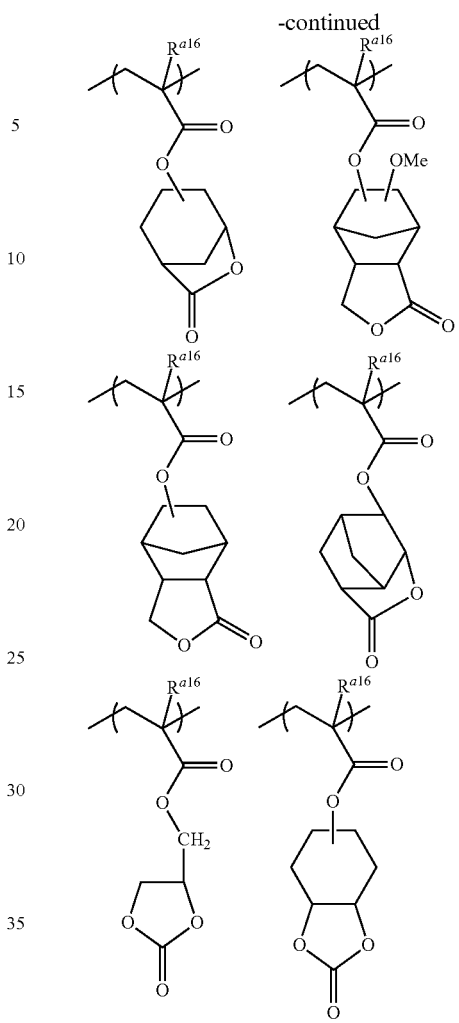

wherein $R^{a16}$ is a hydrogen atom, a fluorine atom, a methyl group, or a trifluoromethyl group, $R^{a7}$ is a hydrogen atom or a methyl group, $R^{a8}$ is a hydrogen atom or a methoxy group, $Z^{a1}$ is a single bond or a methylene group, $Z^{a2}$ is a methylene group or an oxygen atom, and a and b are 0 or 1.

Structural units represented by the following formulas are preferable as the structural unit (a5).

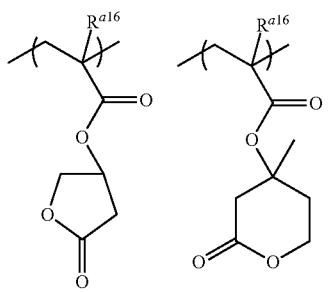

wherein $R^{a16}$ is a hydrogen atom, a fluorine atom, a methyl group, or a trifluoromethyl group.

The content of the structural unit (a5) in the fluorine atom-containing polymer [A] is preferably 50 mol % or less, and more preferably 30 mol % or less, based on the total structural units included in the fluorine atom-containing polymer [A].

Examples of a preferable monomer that produces the structural unit (a5) include the monomers disclosed in WO2007/116664.

The fluorine atom-containing polymer [A] is preferably used in an amount of 0.1 to 20 parts by mass, more preferably 1 to 15 parts by mass, and particularly preferably 1 to 10 parts by mass, based on 100 parts by mass of the polymer [B]. If the amount of the fluorine atom-containing polymer [A] is less than 0.1 parts by mass, a sufficient effect may not be achieved. If the amount of the fluorine atom-containing polymer [A] exceeds 20 parts by mass, the pattern-forming capability of the resist may deteriorate.

Method for Synthesizing Fluorine Atom-Containing Polymer [A]

The fluorine atom-containing polymer [A] may be synthesized by a normal method such as radical polymerization. For example, the fluorine atom-containing polymer [A] is preferably synthesized by adding a solution containing a monomer and a radical initiator dropwise to a reaction solvent or a solution containing a monomer to effect polymerization, or adding a solution containing a monomer and a solution containing a radical initiator dropwise to a reaction solvent or a solution containing a monomer to effect polymerization, or adding a plurality of solutions containing a different monomer and a solution containing a radical initiator dropwise to a reaction solvent or a solution containing a monomer to effect polymerization, or subjecting a solution containing a monomer and a radical initiator to polymerization either directly or using a reaction solvent. When adding a monomer solution dropwise to another monomer solution, the amount of monomer in the monomer solution that is added dropwise to the other monomer solution is preferably 30 mol % or more, more preferably 50 mol % or more, and particularly preferably 70 mol % or more, based on the total amount of monomer subjected to polymerization.

The reaction temperature may be appropriately determined depending on the type of the initiator. The reaction temperature is normally 30 to 180° C., preferably 40 to 160° C., and more preferably 50 to 140° C. The dropwise addition time is determined depending on the reaction temperature, the type of initiator, the type of monomer, and the like, but is normally 30 minutes to 8 hours, preferably 45 minutes to 6 hours, and more preferably 1 to 5 hours. The total reaction time including the dropwise addition time is also determined depending on the reaction conditions, but is normally 30 minutes to 8 hours, preferably 45 minutes to 7 hours, and more preferably 1 to 6 hours.

Examples of the radical initiator used for polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), and the like. These initiators may be used either alone or in combination.

Examples of the solvent used for polymerization include alcohols such as methanol, ethanol, 1-propanol, 2-propanol, and 4-methyl-2-pentanol; ketones such as acetone, 2-butanone, 4-methyl-2-pentanone, and 2-heptanone; saturated carboxylic acid esters such as ethyl acetate, n-butyl acetate, i-butyl acetate, and methyl propionate; alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; ethers such as tetrahydrofuran, dimethoxyethane, and diethoxyethane; and the like. These solvents may be used either alone or in combination.

A resin obtained by polymerization is preferably collected by reprecipitation. Specifically, the polymer solution is poured into a reprecipitation solvent after completion of polymerization to collect the target resin as a powder. An alcohol, an alkane, or the like may be used as the reprecipitation solvent either alone or in combination. The resin may also be collected by removing low-molecular-weight components (e.g., monomer and oligomer) by performing a separation operation, a column operation, an ultrafiltration operation, or the like.

The polystyrene-reduced weight average molecular weight (Mw) of the fluorine atom-containing polymer [A] determined by gel permeation chromatography (GPC) is not particularly limited, but is preferably 1000 to 500,000, more preferably 2000 to 400,000, and particularly preferably 3000 to 300,000. If the Mw of the fluorine atom-containing polymer [A] is less than 1000, the heat resistance of the resulting resist may deteriorate. If the Mw of the fluorine atom-containing polymer [A] exceeds 500,000, the developability of the resulting resist may deteriorate.

The ratio (Mw/Mn) of the Mw to the polystyrene-reduced number average molecular weight (Mn) of the fluorine atom-containing polymer [A] determined by GPC is normally 1 to 5, preferably 1 to 3, and more preferably 1 to 2. When the ratio (Mw/Mn) of the fluorine atom-containing polymer [A] is within the above range, the resulting photoresist film exhibits excellent resolution.

Note that the terms "polystyrene-reduced weight average molecular weight (Mw)" and "polystyrene-reduced number average molecular weight (Mn)" used herein refer to values determined by GPC using GPC columns manufactured by Tosoh Corporation (G2000HXL×2, G3000HXL×1, G4000HXL×1) at a flow rate of 1.0 ml/min and a column temperature of 40° C. (eluant: tetrahydrofuran, standard: monodisperse polystyrene).

Polymer [B]

The polymer (B) is a base polymer that includes an acid-labile group, and has a fluorine atom content lower than that of the fluorine atom-containing polymer [A]. Since the polymer [B] has a fluorine atom content lower than that of the fluorine atom-containing polymer [A], the fluorine atom-containing polymer [A] tends to be unevenly distributed in the surface layer of a resist film formed using the radiation-sensitive resin composition that includes the polymer [B] and the fluorine atom-containing polymer [A]. Therefore, the fluorine atom-containing polymer [A] more effectively exhibits high hydrophobicity and a high dynamic contact angle. The term "base polymer" used herein refers to a polymer that is used as the main component of a resist film formed using the radiation-sensitive resin composition, and is preferably included in the resist film in an amount of 50 mass % or more based on the total polymers included in the resist film. The fluorine atom content (mass %) may be calculated from the compositional ratio of the structural units included in the polymer [B] and the fluorine atom-containing polymer [A].

It is preferable that the polymer [B] does not include an alkali-labile group. In this case, the polymer [B] is an acid-labile group-containing resin that is insoluble or scarcely soluble in an alkali, but becomes alkali-soluble upon dissociation of the acid-labile group. When the polymer [B] does not include an alkali-labile group, the polymer [B] is insoluble in an alkaline developer in the unexposed area. The expression "insoluble or scarcely soluble in an alkali" used herein means that a film that is formed only of the polymer [B] has a thickness equal to or more than 50% of the initial thickness when developed under the alkaline development conditions employed when forming a resist pattern using a resist film that is formed of the radiation-sensitive resin composition.

The polymer [B] includes a structural unit (b1) that includes an acid-labile group, and may include a structural unit (b2) that includes a lactone structure or a cyclic carbonate structure, and a structural unit (b3) that includes a polar group.

Examples of the structural unit (b1) include the structural units mentioned above in connection with the structural unit (a2) that may be included in the fluorine atom-containing polymer [A]. Examples of the structural unit (b2) include the structural units mentioned above in connection with the structural unit (a5) that may be included in the fluorine atom-containing polymer [A]. Examples of the structural unit (b3) include the structural units mentioned above in connection with the structural unit (a4) that may be included in the fluorine atom-containing polymer [A].

The content of the structural unit (b1) in the polymer [B] is preferably 5 to 90 mol %, more preferably 10 to 80 mol %, and particularly preferably 20 to 70 mol %, based on the total structural units included in the polymer [B]. If the content of the structural unit (b1) exceeds 90 mol %, the resulting resist film may exhibit insufficient adhesion, and the pattern may collapse, or may be removed. Note that the polymer [B] may include two or more types of the structural unit (b1).

The content of the structural unit (b2) in the polymer [B] is preferably 0 to 70 mol %, and more preferably 10 to 60 mol %, based on the total structural units included in the polymer [B]. When the content of the structural unit (b2) is within the above range, the resulting resist film exhibits improved adhesion to the substrate. If the content of the repeating unit (b2) exceeds 70 mol %, the resulting resist may show a decrease in resolution or an increase in LWR.

The content of the structural unit (b3) in the polymer [B] is preferably 0 to 30 mol %, and more preferably 5 to 20 mol %, based on the total structural units included in the polymer [B].

Method for Synthesizing Polymer [B]

The polymer [B] may be synthesized by polymerizing a monomer that produces each structural unit in an appropriate solvent using a radical initiator, for example.

Examples of the solvent used for polymerization include those mentioned above in connection with the method for synthesizing the fluorine atom-containing polymer [A].

The reaction (polymerization) temperature is normally 40 to 150° C., and preferably 50 to 120° C. The reaction time is normally 1 to 48 hours, and preferably 1 to 24 hours.

The Mw of the polymer [B] determined by GPC is preferably 1000 to 100,000, more preferably 1000 to 50,000, and particularly preferably 1000 to 30,000. When the Mw of the polymer [B] is within the above range, the radiation-sensitive resin composition exhibits excellent lithographic performance.

The ratio (Mw/Mn) of the Mw to the Mn of the polymer [B] is normally 1 to 3, and preferably 1 to 2.

The content of the polymer [B] in the radiation-sensitive resin composition is normally 50 mass % or more, and preferably 60 mass % or more, based on the total solid content in the radiation-sensitive resin composition. If the content of the polymer [B] is less than 50 mass %, the resolution of the resulting resist may decrease.

Acid Generator [C]

The acid generator [C] generates an acid upon exposure, and the acid-labile groups included in the fluorine atom-containing polymer [A] and the polymer [B] dissociate due to the acid generated by the acid generator [C]. As a result, the fluorine atom-containing polymer [A] and the polymer [B] become soluble in a developer. The acid generator [C] may be included in the radiation-sensitive resin composition as a compound (described below), and/or may be included in the polymer.

Examples of the acid generator [C] include onium salt compounds such as sulfonium salts and iodonium salts, organic halogen compounds, and sulfone compounds such as disulfones and diazomethanesulfones. Specific examples of a preferable acid generator [C] include the compounds disclosed in paragraphs [0080] to [0113] of Japanese Patent Application Publication (KOKAI) No. 2009-134088, and the like.

The acid generator [C] is preferably diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium perfluoro-n-octanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-hydroxy-1-naphthyltetrahydrothiophenium nonafluoro-n-butanesulfonate, 4-hydroxy-1-naphthyltetrahydrothiophenium perfluoro-n-octanesulfonate, 1-(1-naphthylacetomethyl)tetrahydrothiophenium trifluoromethanesulfonate, 1-(1-naphthylacetomethyl)tetrahydrothiophenium nonafluoro-n-butanesulfonate, 1-(1-naphthylacetomethyl)tetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, or 1,8-naphthalenedicarboxylic acid imide trifluoromethanesulfonate.

These acid generators [C] may be used either alone or in combination. The acid generator [C] is normally used in an amount of 0.1 to 20 parts by mass, and preferably 0.5 to 15 parts by mass, based on 100 parts by mass of the polymer [B], from the viewpoint of ensuring that the resulting resist exhibits sufficient sensitivity and develop ability. If the amount of the acid generator [C] is less than 0.1 parts by mass, the resulting resist may exhibit insufficient sensitivity and developability. If the amount of the acid generator [C] exceeds 20 parts by mass, the desired resist pattern may not be obtained due to a decrease in transparency to radiation.

Acid Diffusion Controller [D]

The acid diffusion controller [D] controls a phenomenon in which the acid generated by the acid generator [C] upon exposure diffuses in the resist film, and suppresses undesired chemical reactions in the unexposed area. The acid diffusion controller [D] thus improves the resolution of the resulting resist, and improves the storage stability of the radiation-sensitive resin composition. The acid diffusion controller [D] may be included in the radiation-sensitive resin composition as a free compound, and/or may be included in the polymer.

Examples of the acid diffusion controller [D] include a compound represented by the following formula.

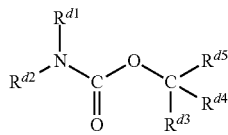

wherein $R^{d1}$ to $R^{d5}$ are independently a hydrogen atom, a linear, branched, or cyclic alkyl group having 1 to 20 carbon atoms, an aryl group, or an aralkyl group, provided that these groups may be substituted with a substituent, $R^{d1}$ and $R^{d2}$ may bond to each other to form a divalent saturated or unsaturated hydrocarbon group having 4 to 20 carbon atoms, or a group derived therefrom, together with the nitrogen atom to which $R^{d1}$ and $R^{d2}$ are bonded, and/or $R^{d3}$ and $R^{d4}$ may bond to each other to form a divalent saturated or unsaturated hydrocarbon group having 4 to 20 carbon atoms, or a group derived therefrom, together with the carbon atom to which $R^{d3}$ and $R^{d4}$ are bonded.

Examples of the acid diffusion controller [D] represented by the above formula include N-t-alkylalkoxycarbonyl group-containing amino compounds such as N-t-butoxycarbonyldi-n-octylamine, N-t-amyloxycarbonyldi-n-octylamine, N-t-butoxycarbonyldi-n-nonylamine, N-t-amyloxycarbonyldi-n-nonylamine, N-t-butoxycarbonyldi-n-decylamine, N-t-amyloxycarbonyldi-n-decylamine, N-t-butoxycarbonyldicyclohexylamine, N-t-amyloxycarbonyldicyclohexylamine, N-t-butoxycarbonyl-1-adamantylamine, N-t-amyloxycarbonyl-1-adamantylamine, N-t-butoxycarbonyl-2-adamantylamine, N-t-amyloxycarbonyl-2-adamantylamine, N-t-butoxycarbonyl-N-methyl-1-adamantylamine, N-t-amyloxycarbonyl-N-methyl-1-adamantylamine, (S)-(−)-1-(t-butoxycarbonyl)-2-pyrrolidinemethanol, (S)-(−)-1-(t-amyloxycarbonyl)-2-pyrrolidinemethanol, (R)-(+)-1-(t-butoxycarbonyl)-2-pyrrolidinemethanol, (R)-(+)-1-(t-amyloxycarbonyl)-2-pyrrolidinemethanol, N-t-butoxycarbonyl-4-hydroxypiperidine, N-t-amyloxycarbonyl-4-hydroxypiperidine, N-t-butoxycarbonylpyrrolidine, N-t-amyloxycarbonylpyrrolidine, N,N'-di-t-butoxycarbonylpiperazine, N,N'-di-t-amyloxycarbonylpiperazine, N,N-di-t-butoxycarbonyl-1-adamantylamine, N,N-di-t-amyloxycarbonyl-1-adamantylamine, N-t-butoxycarbonyl-4,4'-diaminodiphenylmethane, N-t-amyloxycarbonyl-4,4'-diaminodiphenylmethane, N,N'-di-t-butoxycarbonylhexamethylenediamine, N,N'-di-t-amyloxycarbonylhexamethylenediamine, N,N,N',N'-tetra-t-butoxycarbonylhexamethylenediamine, N,N,N',N'-tetra-t-amyloxycarbonylhexamethylenediamine, N,N'-di-t-butoxycarbonyl-1,7-diaminoheptane, N,N'-di-t-amyloxycarbonyl-1,7-diaminoheptane, N,N'-di-t-butoxycarbonyl-1,8-diaminooctane, N,N'-di-t-amyloxycarbonyl-1,8-diaminooctane, N,N'-di-t-butoxycarbonyl-1,9-diaminononane, N,N'-di-t-amyloxycarbonyl-1,9-diaminononane, N,N'-di-t-butoxycarbonyl-1,10-diaminodecane, N,N'-di-t-amyloxycarbonyl-1,10-diaminodecane, N,N'-di-t-butoxycarbonyl-1,12-diaminododecane, N,N'-di-t-amyloxycarbonyl-1,12-diaminododecane, N,N'-di-t-butoxycarbonyl-4,4'-diaminodiphenylmethane, N,N'-di-t-amyloxycarbonyl-4,4'-diaminodiphenylmethane, N-t-butoxycarbonylbenzimidazole, N-t-butoxycarbonylbenzimidazole, N-t-amyloxycarbonyl-2-methylbenzimidazole, N-t-butoxycarbonyl-2-phenylbenzimidazole, and N-t-amyloxycarbonyl-2-phenylbenzimidazole, and the like.

Further examples of the acid diffusion controller include tertiary amine compounds, quaternary ammonium hydroxide compounds, photodegradable base compounds, nitrogen-containing heterocyclic compounds, and the like.

Examples of the tertiary amines include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyldimethylamine, dicyclohexylmethylamine, and tricyclohexylamine, aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline, alkanolamines such as triethanolamine and N,N-di(hydroxyethyl)aniline, N,N,N',N'-tetramethylethylenediamine, N,N,N',N'-tetrakis(2-hydroxypropyl)ethylenediamine, 1,3-bis[1-(4-aminophenyl)-1-methylethyl]benzenetetramethylenediamine, bis(2-dimethylaminoethyl)ether, bis(2-diethylaminoethyl)ether, and the like.

Examples of the quaternary ammonium hydroxide compounds include tetra-n-propylammonium hydroxide, tetra-n-butylammonium hydroxide, and the like.

The acid diffusion controller [D] is preferably used in an amount of 10 parts by mass or less, and more preferably 8 parts by mass or less, based on 100 parts by mass of the polymer [B]. If the amount of the acid diffusion controller [D] exceeds 10 parts by mass, the sensitivity of the resulting resist may decrease.

Solvent [E]

The radiation-sensitive resin composition normally includes the solvent [E]. Examples of the solvent [E] include alcohol-based solvents, ketone-based solvents, amide-based solvents, ether-based solvents, ester-based solvents, a mixed solvent thereof, and the like.

Examples of the alcohol-based solvents include monohydric alcohol-based solvents such as methanol, ethanol, n-propanol, iso-propanol, n-butanol, iso-butanol, sec-butanol, tert-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol-based solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ketone-based solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylenonane, cyclopentanone, cyclohexanone, cycloheptanone, cyclooctanone, methylcyclohexanone, 2,4-pentanedione, acetonylacetone, diacetone alcohol, acetophenone, and the like.

Examples of the amide-based solvents include N,N'-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like.

Examples of the ester-based solvents include diethyl carbonate, methyl acetate, ethyl acetate, n-propyl acetate, iso-propyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Further examples of the solvent include aliphatic hydrocarbon-based solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; halogen-containing solvents such as dichloromethane, chloroform, fluorocarbon, chlorobenzene, and dichlorobenzene; and the like.

Among these, propylene glycol monomethyl ether acetate, propylene glycol monomethyl ether, ethyl lactate, and cyclohexanone are preferable.

The amount of the solvent [E] is appropriately adjusted depending on the desired thickness of the resist film.

Additional Optional Component

The radiation-sensitive resin composition may include [F] an uneven distribution promoter, an alicyclic skeleton-containing compound, a surfactant, a sensitizer, and the like as long as the advantageous effects of the invention are not impaired. Each additional optional component is described in detail below. Each additional optional component may be used either alone or in combination. The content of each additional optional component may be appropriately determined depending on the objective.

Uneven Distribution Promoter [F]

The radiation-sensitive resin composition may include the uneven distribution promoter [F] when the radiation-sensitive resin composition is used to form a resist pattern using liquid immersion lithography, for example. When the radiation-sensitive resin composition includes the uneven distribution promoter [F], the fluorine atom-containing polymer [A] can be more advantageously unevenly distributed in the vicinity of the surface layer. Examples of the uneven distribution promoter [F] include a low-molecular-weight compound having a relative dielectric constant of 30 to 200 and a boiling point at 1 atmosphere of 100° C. or more. Examples of such a compound include lactone compounds, carbonate compounds, nitrile compounds, polyhydric alcohols, and the like.

Examples of the lactone compounds include γ-butyrolactone, valerolactone, mevalonic lactone, norbornanelactone, and the like.

Examples of the carbonate compounds include propylene carbonate, ethylene carbonate, butylene carbonate, vinylene carbonate, and the like.

Examples of the nitrile compounds include succinonitrile and the like. Examples of the polyhydric alcohols include glycerol and the like.

The uneven distribution promoter [F] is preferably used in an amount of 10 to 500 parts by mass, and more preferably 30 to 300 parts by mass, based on 100 parts by mass of the total polymers included in the radiation-sensitive resin composition. These uneven distribution promoters [F] may be used either alone or in combination.

Alicyclic Skeleton-Containing Compound

The alicyclic skeleton-containing compound further improves the dry etching resistance, the pattern shape, adhesion to a substrate, and the like. Examples of the alicyclic skeleton-containing compound include adamantane derivatives such as 1-adamantanecarboxylic acid, 2-adamantanone, and t-butyl 1-adamantanecarboxylate, deoxycholates such as t-butyl deoxycholate, t-butoxycarbonylmethyl deoxycholate, and 2-ethoxyethyl deoxycholate, lithocholates such as t-butyl lithocholate, t-butoxycarbonylmethyl lithocholate, and 2-ethoxyethyl lithocholate, 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxatricyclo[4.2.1.0$^{3,7}$]nonane, and the like.

Surfactant

The surfactant improves the applicability, striation, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

Sensitizer

The sensitizer absorbs the energy of radiation, and transmits the absorbed energy to the acid generator [C] so that the amount of acid generated increases. The sensitizer thus improves the apparent sensitivity of the radiation-sensitive resin composition. Examples of the sensitizer include carbazoles, acetophenones, benzophenones, naphthalenes, phenols, biacetyl, eosine, rose bengal, pyrenes, anthracenes, phenothiazines, and the like.

Preparation of Radiation-Sensitive Resin Composition

The radiation-sensitive resin composition may be prepared by mixing the fluorine atom-containing polymer [A], the acid generator [C], the polymer [B] (preferable component), the acid diffusion controller [D] (optional component), and an additional optional component in the solvent [E] in a given ratio, for example. The radiation-sensitive resin composition is normally prepared by dissolving the components in the solvent [E] so that the total solid content is 1 to 50 mass %, and preferably 2 to 25 mass %, and filtering the solution through a filter having a pore size of about 5 nm, for example. The filter may be formed of an arbitrary material. For example, the filter may be formed of nylon 6,6, nylon 6, polyethylene a combination thereof, or the like.

Resist Film

A resist film according to one embodiment of the invention is formed on a substrate using the resist pattern-forming radiation-sensitive resin composition, and has a surface free energy of 30 to 40 mN/m. It is considered that the surface of the resist film exhibits improved water repellency since the resist film has a surface free energy within the above specific range. Therefore, it is possible to implement high-speed scan exposure, and form an excellent resist pattern by suppressing occurrence of defects (e.g., bridge defects).

EXAMPLES

The invention is further described below by way of examples. Note that the invention is not limited to the following examples. In the examples, synthesis examples, and comparative examples, the unit "parts" refers to "parts by mol", and the unit "%" refers to "mol %" unless otherwise specified. The property values were measured by the following methods.

Polystyrene-Reduced Weight Average Molecular Weight (Mw)

The polystyrene-reduced number average molecular weight (Mn) was measured by gel permeation chromatography (GPC) using GPC columns manufactured by Tosoh Corporation (G2000HXL×2, G3000HXL×1, G4000HXL×1) at a flow rate of 1.0 ml/min and a column temperature of 40° C. (eluant: tetrahydrofuran, standard: monodisperse polystyrene).

Polystyrene-Reduced Number Average Molecular Weight (Mn)

The polystyrene-reduced number average molecular weight (Mn) was measured by gel permeation chromatography (GPC) using GPC columns manufactured by Tosoh Corporation (G2000HXL×2, G3000HXL×1, G4000HXL×1) at a flow rate of 1.0 ml/min and a column temperature of 40° C. (eluant: tetrahydrofuran, standard: monodisperse polystyrene).

$^{13}$C-NMR Analysis

NMR analysis was performed using a nuclear magnetic resonance spectrometer ("JNM-ECX400" manufactured by JEOL Ltd.).

Synthesis of Fluorine Atom-Containing Polymer [A] and Polymer [B]

The following monomers were used to synthesize the fluorine atom-containing polymer [A] and the polymer [B].

(M-1)
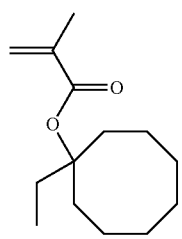

(M-2)
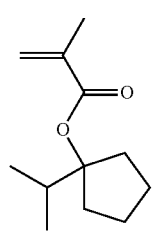

(M-3)
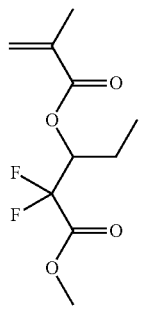

(M-4)
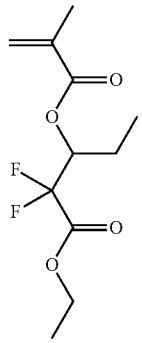

(M-5)
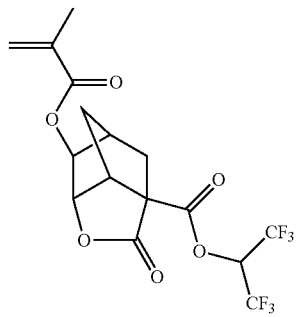

(M-6)
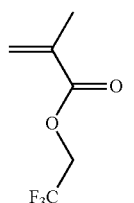

(M-7)
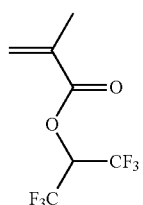

(M-8)

-continued

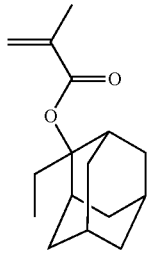
(M-9)

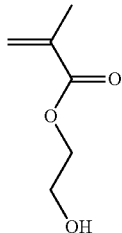
(M-10)

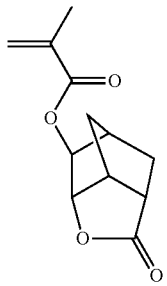
(M-11)

Synthesis Example 1

Polymer (A-1)

38.77 g (40 mol %) of the monomer (M-1), 56.13 g (55 mol %) of the monomer (M-3), and 5.10 g (5 mol %) of the monomer (M-7) were dissolved in 100 g of 2-butanone, and 4.97 g (7 mol % based on the total number of moles of the monomers) of AIBN (initiator) was added to the solution to prepare a monomer solution.

A 500 ml three-necked flask equipped with a thermometer and a dropping funnel was charged with 100 g of 2-butanone, and purged with nitrogen for 30 minutes. The inside of the flask was then heated to 80° C. with stirring using a magnetic stirrer. The monomer solution was added dropwise to the flask over 3 hours using the dropping funnel. The monomers were polymerized for 6 hours from the start of dropwise addition of the monomer solution. After completion of polymerization, the polymer solution was cooled with water to 30° C. or less. The reaction solution, 300 g of hexane, 1200 g of methanol, and 60 g of water were poured into a separating funnel, and the mixture was vigorously stirred, and then allowed to stand. The mixture was thus separated into two layers. After allowing the mixture to stand for 3 hours, the lower layer (resin solution) was isolated preparatively. The solvent of the resin solution was replaced with propylene glycol monomethyl ether acetate using an evaporator. 239.2 g of a propylene glycol monomethyl ether acetate solution of a copolymer was thus obtained. The solid content in the solution was determined using a hot plate. It was found that the copolymer concentration was 20.9%, and the yield was 50%. The copolymer is hereinafter referred to as "polymer (A-1)".

The copolymer had an Mw of 4200 and a dispersity (Mw/Mn) of 1.4. The ratio of the content of structural units derived from the compound (M-1), the content of structural units derived from the compound (M-3), and the content of structural units derived from the compound (M-7) in the copolymer (determined by $^{13}$C-NMR analysis) was 40.5:54.1:5.4 (=(M-1):(M-3):(M-7)) (mol %).

Polymers (A-2) to (A-8) and polymers (B-1) to (B-3) were synthesized in the same manner as in Synthesis Example 1, except that the types and the amounts of the monomers were changed as shown in Tables 1 and 2. The content of structural units derived from each monomer, the Mw, the dispersity (Mw/Mn), and the yield of each polymer are shown in Table 3.

Synthesis Example 12

Polymer (B-4)

13.42 g (30 mol %) of the monomer (M-8), 6.10 g (10 mol %) of the monomer (M-9), 3.20 g (10 mol %) of the monomer (M-10), and 27.28 g (50 mol %) of the monomer (M-11) were dissolved in 100 g of 2-butanone, and 4.03 g (10 mol % based on the total number of moles of the monomers) of AIBN (initiator) was added to the solution to prepare a monomer solution.

A 500 ml three-necked flask equipped with a thermometer and a dropping funnel was charged with 50 g of 2-butanone and 6.10 g (10 mol %) of the monomer (M-10) to effect dissolution, and purged with nitrogen for 30 minutes. The inside of the flask was then heated to 80° C. with stirring using a magnetic stirrer. The monomer solution was added dropwise to the flask over 3 hours using the dropping funnel. The monomers were polymerized for 6 hours from the start of dropwise addition of the monomer solution. After completion of polymerization, the polymer solution was cooled with water to 30° C. or less. The polymer solution was then added to a mixture of 800 g of methanol and 200 g of water, and a white powder that precipitated by this operation was filtered off. The white powder was washed twice with 200 g of methanol in a slurry state. The white powder was again filtered off, and dried at 60° C. for 17 hours to obtain a white powdery polymer (B-4) (34.2 g, yield: 68%).

TABLE 1

| | Fluorine atom-containing polymer [A] | Monomer | |
|---|---|---|---|
| | | Type | Amount (mol %) |
| Synthesis Example 1 | A-1 | M-1 | 40 |
| | | M-3 | 55 |
| | | M-7 | 5 |
| Synthesis Example 2 | A-2 | M-1 | 40 |
| | | M-4 | 55 |
| | | M-6 | 5 |
| Synthesis Example 3 | A-3 | M-1 | 40 |
| | | M-5 | 55 |
| | | M-6 | 5 |
| Synthesis Example 4 | A-4 | M-2 | 40 |
| | | M-3 | 55 |
| | | M-7 | 5 |
| Synthesis Example 5 | A-5 | M-2 | 40 |
| | | M-4 | 55 |
| | | M-6 | 5 |

TABLE 1-continued

| | Fluorine atom-containing polymer [A] | Monomer Type | Monomer Amount (mol %) |
|---|---|---|---|
| Synthesis Example 6 | A-6 | M-2 | 40 |
| | | M-5 | 55 |
| | | M-6 | 5 |
| Synthesis Example 7 | A-7 | M-1 | 50 |
| | | M-3 | 45 |
| | | M-7 | 5 |
| Synthesis Example 8 | A-8 | M-1 | 20 |
| | | M-2 | 20 |
| | | M-3 | 55 |
| | | M-7 | 5 |

TABLE 2

| | Polymer [B] | Monomer Type | Monomer Amount (mol %) |
|---|---|---|---|
| Synthesis Example 9 | B-1 | M-1 | 20 |
| | | M-3 | 80 |
| Synthesis Example 10 | B-2 | M-1 | 40 |
| | | M-4 | 60 |
| Synthesis Example 11 | B-3 | M-2 | 70 |
| | | M-6 | 30 |
| Synthesis Example 12 | B-4 | M-8 | 30 |
| | | M-9 | 10 |
| | | M-10 | 10 |
| | | M-11 | 50 |

Table 3 shows the property values of the polymers obtained in Synthesis Examples 1 to 12.

TABLE 3

| Polymer | Structural unit Type of monomer | Structural unit Content (mol %) | Property value Mw | Property value Mw/Mn | Yield (%) |
|---|---|---|---|---|---|
| A-1 | M-1 | 40.5 | 4200 | 1.4 | 50 |
| | M-3 | 54.1 | | | |
| | M-7 | 5.4 | | | |
| A-2 | M-1 | 40.2 | 4100 | 1.4 | 51 |
| | M-4 | 54.3 | | | |
| | M-6 | 5.5 | | | |
| A-3 | M-1 | 41.0 | 4100 | 1.4 | 53 |
| | M-5 | 54.5 | | | |
| | M-6 | 4.5 | | | |
| A-4 | M-2 | 40.5 | 4200 | 1.4 | 49 |
| | M-3 | 54.2 | | | |
| | M-7 | 5.3 | | | |
| A-5 | M-2 | 39.9 | 4500 | 1.4 | 49 |
| | M-4 | 54.9 | | | |
| | M-6 | 5.2 | | | |
| A-6 | M-2 | 40.0 | 4100 | 1.4 | 51 |
| | M-5 | 54.4 | | | |
| | M-6 | 5.6 | | | |
| A-7 | M-1 | 50.5 | 4300 | 1.4 | 52 |
| | M-3 | 44.9 | | | |
| | M-7 | 4.6 | | | |
| A-8 | M-1 | 20.2 | 4200 | 1.4 | 51 |
| | M-2 | 19.9 | | | |
| | M-3 | 54.9 | | | |
| | M-7 | 5.0 | | | |
| B-1 | M-1 | 20.1 | 4200 | 1.4 | 47 |
| | M-3 | 79.9 | | | |
| B-2 | M-1 | 40.2 | 4100 | 1.4 | 48 |
| | M-4 | 59.8 | | | |
| B-3 | M-2 | 69.5 | 4500 | 1.4 | 55 |
| | M-6 | 30.5 | | | |
| B-4 | M-8 | 29.0 | 4300 | 1.3 | 68 |
| | M-9 | 8.0 | | | |
| | M-10 | 18.0 | | | |
| | M-11 | 52.9 | | | |

Preparation of Radiation-Sensitive Resin Composition

The components (acid generator [C], acid diffusion controller [D], solvent [E], and uneven distribution promoter [F]) other than the polymers (A-1) to (A-8) and the polymers (B-1) to (B-4) (see synthesis examples) used to prepare the radiation-sensitive resin composition are shown below.

Acid Generator [C]

C-1: compound represented by the following formula

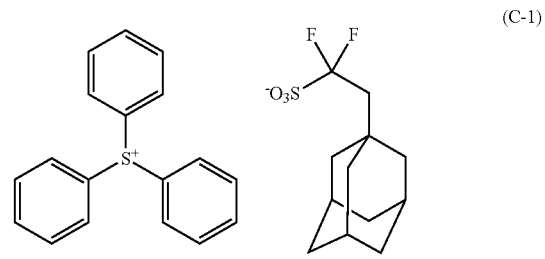

(C-1)

Acid Diffusion Controller [D]

D-1: triphenylsulfonium salicylate

Solvent [E]

E-1: propylene glycol monomethyl ether acetate

E-2: cyclohexanone

Uneven Distribution Promoter [F]

F-1: γ-butyrolactone

Example 1

100 parts by mass of the polymer (B-4) obtained in Synthesis Example 12, 5 parts by mass of the polymer (A-1) obtained in Synthesis Example 1, 12 parts by mass of the acid generator (C-1), 6.2 parts by mass of the acid diffusion controller (D-1), and 100 parts by mass of the uneven distribution promoter (F-1) were mixed. The mixture was dissolved in 2900 parts by mass of the solvent (E-1) (solvent [E]) and 1250 parts by mass of the solvent (E-2) (solvent [E]) to obtain a mixed solution. The mixed solution was filtered through a nylon filter (pore size: 10 nm) and a polyethylene filter (pore size: 5 nm) to prepare a radiation-sensitive resin composition. The radiation-sensitive resin composition is hereinafter referred to as "composition (J-1)".

Examples 2 to 8 and Comparative Examples 1 to 3

Radiation-sensitive resin compositions (J-2) to (J-8) and (K-1) to (K-3) were prepared in the same manner as in Example 1, except that the composition was changed as shown in Table 4. Note that the symbol "—" in Table 4 indicates that the corresponding component was not used.

TABLE 4

| Radiation sensitive resin composition | Fluorine atom-containing polymer [A] Type | Amount (parts by mass) | Polymer [B] Type | Amount (parts by mass) | Acid generator [C] Type | Amount (parts by mass) | Acid diffusion controller [D] Type | Amount (parts by mass) | Solvent [E] Type | Amount (parts by mass) | Uneven distribution promoter [F] Type | Amount (parts by mass) |
|---|---|---|---|---|---|---|---|---|---|---|---|---|
| Example 1 | J-1 | A-1 | 5 | B-4 | 100 | C-1 | 12 | D-1 | 6.2 | E-1<br>E-2 | 2900<br>1250 | F-1 | 100 |
| Example 2 | J-2 | A-2 | 5 | B-4 | 100 | C-1 | 12 | D-1 | 6.2 | E-1<br>E-2 | 2900<br>1250 | F-1 | 100 |
| Example 3 | J-3 | A-3 | 5 | B-4 | 100 | C-1 | 12 | D-1 | 6.2 | E-1<br>E-2 | 2900<br>1250 | F-1 | 100 |
| Example 4 | J-4 | A-4 | 5 | B-4 | 100 | C-1 | 12 | D-1 | 6.2 | E-1<br>E-2 | 2900<br>1250 | F-1 | 100 |
| Example 5 | J-5 | A-5 | 5 | B-4 | 100 | C-1 | 12 | D-1 | 6.2 | E-1<br>E-2 | 2900<br>1250 | F-1 | 100 |
| Example 6 | J-6 | A-6 | 5 | B-4 | 100 | C-1 | 12 | D-1 | 6.2 | E-1<br>E-2 | 2900<br>1250 | F-1 | 100 |
| Example 7 | J-7 | A-7 | 5 | B-4 | 100 | C-1 | 12 | D-1 | 6.2 | E-1<br>E-2 | 2900<br>1250 | F-1 | 100 |
| Example 8 | J-8 | A-8 | 18 | B-4 | 100 | C-1 | 12 | D-1 | 6.2 | E-1<br>E-2 | 2900<br>1250 | F-1 | 100 |
| Comparative Example 1 | K-1 | — | — | B-1<br>B-4 | 18<br>100 | C-1 | 12 | D-1 | 6.2 | E-1<br>E-2 | 2900<br>1250 | F-1 | 100 |
| Comparative Example 2 | K-2 | — | — | B-2<br>B-4 | 5<br>100 | C-1 | 12 | D-1 | 6.2 | E-1<br>E-2 | 2900<br>1250 | F-1 | 100 |
| Comparative Example 3 | K-3 | — | — | B-3<br>B-4 | 5<br>100 | C-1 | 12 | D-1 | 6.2 | E-1<br>E-2 | 2900<br>1250 | F-1 | 100 |

Evaluation of Lithographic Performance

The receding contact angle, the surface free energy, the scan speed, the sensitivity, the number of defects, the LWR, and the MEF were evaluated using the compositions (J-1) to (J-8) obtained in Examples 1 to 8 and the compositions (K-1) to (K-3) obtained in Comparative Examples 1 to 3. The property values were measured by the following methods.

Measurement of Receding Contact Angle

A film was formed on a substrate (wafer) using the radiation-sensitive resin composition. The receding contact angle of the film was measured by the following method at a temperature of 23° C. (room temperature) and a humidity of 45% under normal pressure using a contact angle meter ("DSA-10" manufactured by KRUS).

Specifically, the position of the wafer stage was adjusted, and the wafer was placed on the stage. After injecting water into the needle, the position of the needle was finely adjusted (initial position). Next, water was discharged from the needle to form a water droplet (25 µl) on the wafer, and the needle was withdrawn from the water droplet. The needle was then moved downward to the initial position. The water droplet was sucked via the needle for 90 seconds at a rate of 10 µl/min, and the contact angle was measured every second (90 times in total). The average value of twenty contact angles measured after the value became stable was calculated, and taken as the receding contact angle (°) with water.

The static receding contact angle was also measured using an aqueous solution (TMAH aqueous solution) (pH: 13) prepared by dissolving tetraammonium hydroxide in water. The measured contact angle was taken as the receding contact angle (°) with the TMAH aqueous solution (pH: 10).

Measurement of Surface Free Energy

A film (thickness: 75 nm) was formed on an 8-inch silicon wafer by applying the radiation-sensitive resin composition at 1500 rpm in a clean room (temperature: 23° C. (room temperature), humidity: 45%, pressure: normal pressure) utilizing a coater/developer "Clean Track Act 8" (manufactured by Tokyo Electron Ltd.), and soft-baked (SB) at 120° C. for 60 seconds. The static contact angle of the film was measured by the following method at a temperature of 23° C. (room temperature) and a humidity of 45% under normal pressure using a contact angle meter ("DSA-10" manufactured by KRUS).

Specifically, the position of the wafer stage was adjusted, and the wafer was placed on the stage. After injecting water into the needle, the position of the needle was finely adjusted (initial position). Next, water was discharged from the needle to form a water droplet (5 µl) on the wafer, and the needle was withdrawn from the water droplet. The contact angle was then measured, and taken as the static contact angle (°) with water. The static contact angle was also measured using methylene iodide instead of water, and taken as the static contact angle (°) with methylene iodide. The surface free energy of the resist film was calculated using Fawkes' equation, Young's equation, and Dupre's equation. Note that the surface free energy of the resist film was calculated using 72.8 mN/m (dispersion term: 21.8 mN/m, polar term: 51.0 mN/m) as the surface free energy of water, and using 50.8 mN/m (dispersion term: 48.3 mN/m, polar term: 2.5 mN/m) as the surface free energy of methylene iodide.

Measurement of Scan Speed

A film was formed on a substrate (wafer) using the radiation-sensitive resin composition. The scan speed was measured by the following method using the film at a temperature of 23° C. (room temperature) and a humidity of 45% under normal pressure utilizing a pin scan speed measurement system manufactured by Nikon Corporation.

Specifically, the space between the wafer (on which the film of the radiation-sensitive resin composition was formed) and the pin scan head (diameter: 4 mm) was filled with water. Note that the distance between the wafer and the pin scan head was set to 1 mm. The pin scan head was then moved (scanned) in the direction parallel to the surface of the wafer, and the state of water that followed the pin scan head was observed with the naked eye. The wafer scan speed was gradually increased, and the critical scan speed at which water could not follow the wafer scan speed, and water droplets started to remain on the back side of the pin scan head, was determined to evaluate the scan speed. A high critical scan speed indicates that water can follow a high scan speed, and the process margin of liquid immersion lithography on the resist film is good.

Sensitivity

A film (thickness: 75 nm) was formed on a 12-inch silicon wafer (on which an underlayer antireflective film ("ARC66" manufactured by Nissan Chemical Industries, Ltd.) was formed) using the radiation-sensitive resin composition utilizing a coater/developer "Clean Track Act 12" (manufactured by Tokyo Electron Ltd.), and soft-baked (SB) at 120° C. for 60 seconds. The film was exposed via a mask pattern using an ArF immersion scanner ("NSR S610C" manufactured by Nikon Corporation) (NA=1.3, iNA=1.27, ratio=0.750, Dipole). The film was then subjected to post-exposure bake (PEB) at 85° C. for 60 seconds using a coater/developer "Clean Track Lithius Pro-i" (manufactured by Tokyo Electron Ltd.). The film was then developed using a 2.38 mass % tetramethylammonium hydroxide aqueous solution, rinsed with water, and dried to form a positive resist pattern. A dose at which a line-and-space pattern having a line width of 45 nm was formed was determined to be the sensitivity (optimum dose) (mJ/cm$^2$).

Defects

A line-and-space pattern having a line width of 45 nm was formed over the entire wafer at the optimum dose using the above method to obtain a defect inspection wafer. A scanning electron microscope ("CC-4000" manufactured by Hitachi High-Technologies Corporation) was used for the measurement.

The number of defects on the defect inspection wafer was measured using an inspection system "KLA2810" (manufactured by KLA-Tencor). The number of defects (repeater defects) detected at the same position within each shot (i.e., defects due to the mask) was subtracted from the total number of defects measured using the inspection system, and the resulting value was taken as the number of defects.

Line Width Roughness (LWR)

A 45 nm line-and-space pattern resolved on the defect inspection wafer at the optimum dose was observed from above using the scanning electron microscope, and the line width was measured at an arbitrary 10 points. The 3 sigma value (dispersion) of the line width measured values was evaluated as the LWR (nm).

Mask Error Factor (MEF)

A film (thickness: 75 nm) was formed on a 12-inch silicon wafer (on which an underlayer antireflective film ("ARC66" manufactured by Nissan Chemical Industries, Ltd.) was formed) using the radiation-sensitive resin composition, and soft-baked (SB) at 120° C. for 60 seconds. The film was exposed via a mask pattern using an ArF immersion scanner ("NSR S610C" manufactured by Nikon Corporation) (NA=1.3, iNA=1.27, ratio=0.750, Dipole).

The film was then subjected to post-exposure bake (PEB) at 85° C. for 60 seconds. The film was developed using a 2.38 mass % tetramethylammonium hydroxide aqueous solution, rinsed with water, and dried to form a positive resist pattern. A dose at which a line-and-space pattern having a line width of 45 nm was formed was determined to be an optimum dose (Eop). A 1 L/1S pattern (pitch: 90 nm) was formed at the optimum dose (Eop) using a mask pattern having a target line width of 40 nm, 42 nm, 44 nm, 46 nm, 48 nm, or 50 nm.

A graph was drawn by plotting the target size (nm) (horizontal axis) and the line width (nm) of the resist film formed using each mask pattern (vertical axis), and the slope of the straight line of the graph was calculated to be the MEF. An MEF (i.e., the slope of the straight line) that is closer to 1 indicates that the mask reproducibility is better.

The results are shown in Table 5.

TABLE 5

| | | Receding contact angle | | Surface free energy | | | | | | | |
|---|---|---|---|---|---|---|---|---|---|---|---|
| | Radiation sensitive resin composition | Water (°) | TMAH aqueous solution (pH:10) (°) | Static contact angle with water (°) | Static contact angle with methylene iodide (°) | Surface free energy (mN/m) | Scan speed (mm/s) | Sensitivity mJ/cm$^2$ | Number of defects (per wafer) | LWR (nm) | MEF |
| Example 1 | J-1 | 78 | 33 | 88 | 46 | 37 | 580 | 39 | 310 | 5.1 | 3 |
| Example 2 | J-2 | 78 | 40 | 87 | 44 | 38 | 570 | 39 | 430 | 5.1 | 3 |
| Example 3 | J-3 | 77 | 34 | 86 | 46 | 37 | 560 | 39 | 450 | 5.1 | 3 |
| Example 4 | J-4 | 77 | 33 | 88 | 46 | 37 | 570 | 39 | 750 | 5.1 | 3 |
| Example 5 | J-5 | 77 | 40 | 87 | 44 | 38 | 560 | 39 | 890 | 5.1 | 3 |
| Example 6 | J-6 | 76 | 34 | 86 | 46 | 37 | 550 | 39 | 920 | 5.1 | 3 |
| Example 7 | J-7 | 78 | 35 | 88 | 42 | 39 | 580 | 39 | 330 | 5.1 | 3 |
| Example 8 | J-8 | 78 | 33 | 88 | 46 | 37 | 580 | 39 | 550 | 5.1 | 3 |
| Comparative Example 1 | K-1 | 76 | 27 | 82 | 28 | 45 | 500 | 39 | 17830 | 5.1 | 3 |
| Comparative Example 2 | K-2 | 77 | 39 | 84 | 31 | 44 | 510 | 39 | 4320 | 5.1 | 3 |
| Comparative Example 3 | K-3 | 80 | 75 | 90 | 30 | 45 | 600 | 39 | >125000 | 5.1 | 3 |

As shown in Table 5, the compositions obtained in Examples 1 to 8 and Comparative Examples 1 to 3 showed a high receding contact angle with water of 76 to 80°. However, the compositions obtained in Comparative Examples 1 and 2 showed a low scan speed of 500 to 510 mm/s. It was thus confirmed that the compositions obtained in Examples 1 to 8 and Comparative Example 3 will exhibit sufficiently high hydrophobicity during liquid immersion lithography, and the compositions obtained in Comparative Examples 1 and 2 will not exhibit sufficient hydrophobicity during liquid immersion lithography. The compositions obtained in Examples 1 to 8 showed a low surface free energy of 40 or less (i.e., showed a sufficient water barrier capability). In contrast, the compositions obtained in Comparative Examples 1 to 3 showed a high surface free energy of 44 to 45 (i.e., showed an insufficient water barrier capability).

As shown in Table 5, the compositions obtained in Examples 1 to 8 and Comparative Example 2 showed a receding contact angle with the TMAH aqueous solution (pH: 10) of 32 to 40° (i.e., within the range of 30 to 40°). It was thus confirmed that the compositions (resist films) obtained in Examples 1 to 8 and Comparative Example 2 will exhibit moderate wettability with a developer during development. In contrast, the composition obtained in Comparative Example 1 showed a low receding contact angle with the TMAH aqueous solution (pH: 10) of 27°. It was thus confirmed that the composition (resist film) obtained in Comparative Example 1 will exhibit excessive wettability with a developer during development. The composition obtained in Comparative Example 3 showed a high receding contact angle with the TMAH aqueous solution (pH: 10) of 75°. It was thus confirmed that the composition (resist film) obtained in Comparative Example 3 will exhibit insufficient wettability with a developer during development.

In Comparative Examples 1 to 3, a large number of defects were detected. In Examples 1 to 8, the number of defects was significantly smaller than those of Comparative Examples 1 to 3. It was thus confirmed that sufficiently high hydrophobicity during liquid immersion lithography and moderate wettability with a developer are necessary for reducing the number of defects.

A rectangular line-and-space pattern was obtained in Examples 1 to 8 and Comparative Examples 1 to 3.

The resist pattern-forming method according to the embodiments of the invention makes it possible to implement high-speed scan exposure, and form an excellent resist pattern by suppressing occurrence of defects (e.g., bridge defects).

Obviously, numerous modifications and variations of the present invention are possible in light of the above teachings. It is therefore to be understood that within the scope of the appended claims, the invention may be practiced otherwise than as specifically described herein.

The invention claimed is:

1. A resist pattern-forming method comprising:
providing a resist film having a surface free energy of 30 to 40 mN/m is on a substrate using a radiation-sensitive resin composition;
exposing the resist film by applying radiation through a mask; and
developing the exposed resist film,
wherein the radiation-sensitive resin composition comprises:
a fluorine atom-containing polymer which comprises a first structural unit that comprises an alkali-labile group, the alkali-labile group being a group that substitutes a hydrogen atom of a polar functional group, and that dissociates in a presence of an alkali such that the polar functional group is generated;
a base polymer that comprises an acid-labile group, and that has a fluorine atom content lower than a fluorine atom content of the fluorine atom-containing polymer;
an acid generator; and
an acid diffusion controller.

2. The resist pattern-forming method according to claim 1, wherein the exposing of the resist film comprises exposing the resist film through an immersion liquid that is provided over the resist film.

3. The resist pattern-forming method according to claim 1, wherein the fluorine atom-containing polymer comprises a second structural unit that comprises an acid-labile group.

4. The resist pattern-forming method according to claim 3, wherein the fluorine atom-containing polymer comprises a third structural unit that does not include an alkali-labile group, but comprises a fluorine atom.

5. The resist pattern-forming method according to claim 1, wherein the fluorine atom-containing polymer comprises a third structural unit that does not include an alkali-labile group, but comprises a fluorine atom.

6. The resist pattern-forming method according to claim 1, wherein the radiation-sensitive resin composition further comprises a solvent which comprises a polyhydric alcohol partial ether-based solvent, a ketone solvent, or both thereof.

7. The resist pattern-forming method according to claim 6, wherein the radiation-sensitive resin composition further comprises an uneven distribution promoter which has a relative dielectric constant of 30 to 200 and a boiling point at 1 atmosphere of 100° C. or more.

8. The resist pattern-forming method according to claim 7, wherein the uneven distribution promoter is γ-butyrolactone, valerolactone, mevalonic lactone, norbornanelactone, propylene carbonate, ethylene carbonate, butylene carbonate, vinylene carbonate, succinonitril, glycerol, or combinations thereof.

9. The resist pattern-forming method according to claim 1, wherein the radiation-sensitive resin composition further comprises an uneven distribution promoter which has a relative dielectric constant of 30 to 200 and a boiling point at 1 atmosphere of 100° C. or more.

10. The resist pattern-forming method according to claim 9, wherein the uneven distribution promoter is γ-butyrolactone, valerolactone, mevalonic lactone, norbornanelactone, propylene carbonate, ethylene carbonate, butylene carbonate, vinylene carbonate, succinonitril, glycerol, or combinations thereof.

11. A resist pattern-forming radiation-sensitive resin composition comprising:
a fluorine atom-containing polymer which comprises a first structural unit that comprises an alkali-labile group, the alkali-labile group being a group that substitutes a hydrogen atom of a polar functional group, and that dissociates in a presence of an alkali such that the polar functional group is generated;
a base polymer that comprises an acid-labile group, and that has a fluorine atom content lower than a fluorine atom content of the fluorine atom-containing polymer;
an acid generator; and
an acid diffusion controller,
the resist pattern-forming radiation-sensitive resin composition being capable of forming a resist film having a surface free energy of 30 to 40 mN/m.

12. The resist pattern-forming radiation-sensitive resin composition according to claim 11, wherein the fluorine atom-containing polymer comprises a second structural unit that comprises an acid-labile group.

13. The resist pattern-forming radiation-sensitive resin composition according to claim 12, wherein the fluorine atom-containing polymer comprises a third structural unit that does not include an alkali-labile group, but comprises a fluorine atom.

14. The resist pattern-forming radiation-sensitive resin composition according to claim 11, wherein the fluorine atom-containing polymer comprises a third structural unit that does not include an alkali-labile group, but comprises a fluorine atom.

15. A laminate comprising:
a substrate; and
a resist film having a surface free energy of 30 to 40 mN/m and provided on the substrate, the resist film comprising:
- a fluorine atom-containing polymer which comprises a first structural unit that comprises an alkali-labile group, the alkali-labile group being a group that substitutes a hydrogen atom of a polar functional group, and that dissociates in a presence of an alkali such that the polar functional group is generated;
- a base polymer that comprises an acid-labile group, and that has a fluorine atom content lower than a fluorine atom content of the fluorine atom-containing polymer;
- an acid generator; and
- an acid diffusion controller.

16. The laminate according to claim 15, wherein the fluorine atom-containing polymer comprises a second structural unit that comprises an acid-labile group.

17. The laminate according to claim 16, wherein the fluorine atom-containing polymer comprises a third structural unit that does not include an alkali-labile group, but comprises a fluorine atom.

18. The laminate according to claim 15, wherein the fluorine atom-containing polymer comprises a third structural unit that does not include an alkali-labile group, but comprises a fluorine atom.

* * * * *